United States Patent
Rosnell et al.

(10) Patent No.: US 6,993,087 B2
(45) Date of Patent: Jan. 31, 2006

(54) SWITCHING MODE POWER AMPLIFIER USING PWM AND PPM FOR BANDPASS SIGNALS

(75) Inventors: Seppo Rosnell, Salo (FI); Jukka Varis, Salo (FI)

(73) Assignee: Nokia Mobile Phones Ltd., Espoo (FI)

(*) Notice: Subject to any disclaimer, the term of this patent is extended or adjusted under 35 U.S.C. 154(b) by 790 days.

(21) Appl. No.: 09/896,914

(22) Filed: Jun. 29, 2001

(65) Prior Publication Data

US 2003/0058956 A1   Mar. 27, 2003

(51) Int. Cl.
 H04L 27/04    (2006.01)
 H04L 27/08    (2006.01)
(52) U.S. Cl. ..................................... 375/295
(58) Field of Classification Search ............ 330/124, 330/296, 52, 149, 199, 200, 10, 207, 129, 330/207 A; 455/127, 110, 108, 93, 102, 455/126, 114.3, 115.1; 332/149, 159; 375/295, 375/297, 238, 239, 296
See application file for complete search history.

(56) References Cited

U.S. PATENT DOCUMENTS

| | | | |
|---|---|---|---|
| 3,487,288 A | | 12/1969 | Reid, Jr. et al. |
| 3,896,395 A | | 7/1975 | Cox |
| 5,534,827 A | * | 7/1996 | Yamaji ........................ 332/103 |
| 5,847,602 A | * | 12/1998 | Su .............................. 330/10 |
| 5,942,938 A | * | 8/1999 | Myers et al. .................. 330/10 |
| 6,049,248 A | | 4/2000 | Glas et al. |
| 6,256,482 B1 | * | 7/2001 | Raab ........................... 455/108 |
| 6,480,704 B1 | * | 11/2002 | Pakonen ...................... 455/126 |
| 6,549,067 B1 | * | 4/2003 | Kenington .................... 330/52 |
| 2001/0014593 A1 | * | 8/2001 | McCune ....................... 455/127 |
| 2002/0079962 A1 | * | 6/2002 | Sander ....................... 330/124 R |
| 2002/0196864 A1 | * | 12/2002 | Booth ......................... 375/296 |

FOREIGN PATENT DOCUMENTS

EP  0 863 607  9/1998

OTHER PUBLICATIONS

High-efficiency switched-mode RF power amplifier□□Wagh, P.; Hidya, P.;□□Circuits and Systems, 1999. 42nd Midwest Symposium on ,vol.: 2 , Aug. 8-11, 1999 □□ pp.: 1044-1047 vol. 2□□.*

Switching transients in class-D RF power amplifiers□□Raab, F.H.;□□HF Radio Systems and Techniques, Seventh International Conference on (Conf. Publ. No. 441) , Jul. 7-10, 1997□□pp.: 190-194□□.*

Radio Frequency Pulsewidth Modulation□□Raab, F.; □□Communications, IEEE Transactions on [legacy, pre—1988] , vol.: 21 , Issue: 8 , Aug. 1973 □□pp.:958- 966□□.*

"Bandpass Sigma-Delta Modulation," by R. Schreir and M. Snelgrove, *Electronics Letters*, vol. 25, No. 23, Nov. 9, 1989, pp. 1560-1561.

"Linear High-Efficiency Microwave Power Amplifiers Using Bandpass Delta-Sigma Modulators," by A. Jayaraman, P. F. Chen, G. Hanington, L. Larson and P. Asbeck, *IEEE Microwave and Guided Wave Letters*, vol. 8, No. 3, Mar. 1998, pp. 121-123.

* cited by examiner

*Primary Examiner*—Jay K. Patel
*Assistant Examiner*—Jacob Meek
(74) *Attorney, Agent, or Firm*—Ware, Fressola, Van Der Sluys & Adolphson LLP

(57)   ABSTRACT

Switching mode power amplifiers using pulse width modulation (PWM) and pulse position modulation (PPM) for generating bandpass signals is disclosed. Fully digital implemented transmitter structures having QPSK inputs for phase and amplitude are described.

16 Claims, 18 Drawing Sheets

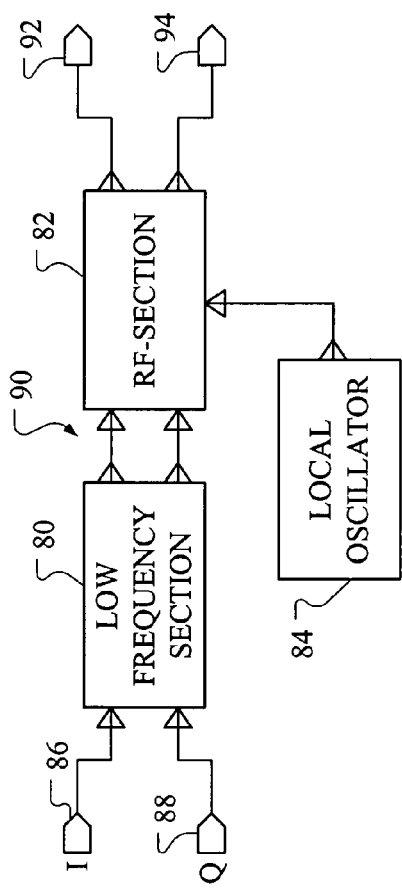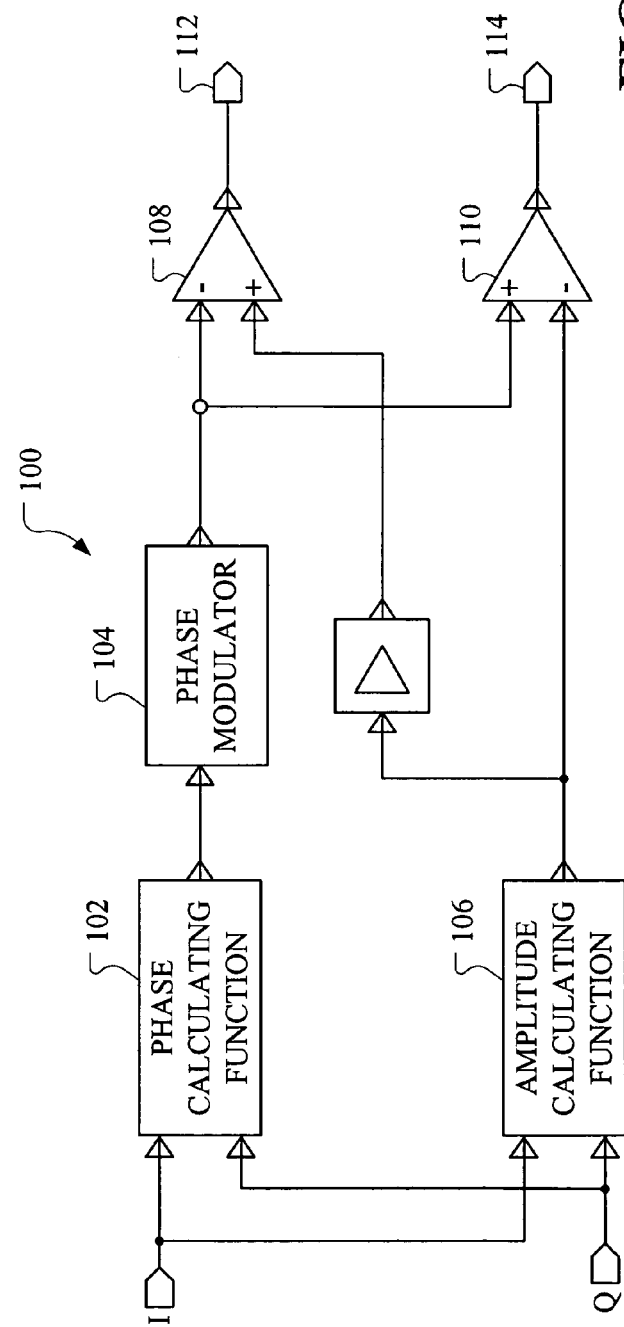

SWITCHING MODE POWER AMPLIFIER USING PWM AND PPM FOR BANDPASS SIGNALS

BACKGROUND OF THE INVENTION

TECHNICAL FIELD

The present invention relates generally to power amplifiers and deals more particularly with transmitter structures having switching mode power amplifiers using pulse width modulation (PWM) and pulse position modulation (PPM) for producing bandpass signals.

Modern cellular communication systems generally use digital modulation techniques to utilize the allocated spectrum efficiently. The envelope of the modulated signal shown in FIG. 1 for a quadrature phase shift keyed (QPSK) modulator is not constant but varies as a function of time. It is known that a linear amplifier is required to avoid amplitude distortion or phase distortion through AM/PM conversion in the amplified variable envelope modulated signal. It is also known that the requirement for linear amplification of a variable envelope modulated signal generally results in a less efficient amplifier than in the case of amplifying constant envelope modulated signal.

One known method for generating a variable envelope modulated signal is to use an IQ-modulator that generates the desired modulation either at IF (intermediate frequency) or at final RF (radio frequency) and then to amplify this modulated signal using a linear amplifier. It is known that a Class-A amplifier provides the most linear amplified signal but unfortunately the best theoretical maximum efficiency is only 50%, which makes Class-A linear amplifiers undesirable for handheld applications. A considerably better efficiency can be achieved by using a Class-B amplifier, whose best maximum theoretical efficiency is 78.5%. A Class-B amplifier is basically a nonlinear device that does not cause intermodulation distortion in theory but pure linear behavior is difficult to obtain in practice.

The disadvantages of Class-A and Class-B amplifiers are partially overcome by using a Class-AB amplifier, which provides a reasonable efficiency compared to Class-A amplifiers and enhanced linearity compared to Class-B amplifiers.

So-called switching mode amplifiers (e.g. classes D or E) are highly efficient (theoretically 100%) but inherently very amplitude nonlinear. They are particularly suitable for use in thermally limited equipment, such as constant envelope cellular or wireless communication devices because heat sinks may be eliminated, or at higher output levels minimized in size. Class D and E amplifiers attempt to supply an equal amount of power from the supply to the load and efficiency would approach 100% but circuit component losses cause the efficiency to drop.

Class-S amplifier topologies have been used in low frequency applications such as audio amplifiers and DC/DC-converters. Class-S amplifier topology is based on using pulse width modulation to change the incoming analog signal to a two-state signal that can be effectively amplified using a nonlinear amplifier (such as the above mentioned class-D amplifier). It is known to code the value of the analog signal in the widths of the modulator output pulses as shown in FIG. 2. The theory is that the long time average ($t \gg 1/F_{pwm}$) of the modulated pulse train is equal to the original analog signal and can be preserved by using a lowpass filter. A functional block diagram of a transmitter is shown in FIG. 3 and generally designated 10 wherein a linear modulator such as, for example, an IQ-modulator 12 receives data at the input 14 to generate the desired modulated RF-signal at its output 16. This modulated RF-signal is next re-modulated by a pulse width modulator 18. The PWM re-modulated signal is amplified by the amplifier 20 and filtered by the lowpass filter 22. This approach to the transmitter design illustrated in FIG. 3 is not satisfactory because the ability to control the power in a way that can be used with a linear amplifier is lost. Additionally, this approach has to date not been feasible at RF-frequencies because of the required high switching frequency, which should be at least about ten times higher than the RF-frequency. Another drawback to the transmitter design approach in FIG. 3 is two RF-frequency modulators are required.

A bandpass delta-sigma modulator (BP-ΔΣ-M/BPDSM) such as described by R. Schier in "Bandpass Sigma-Delta Modulation," *Electronic Letters*, Vol. 25, No. 23, November 1989, has been proposed to generate a two-state signal that is suitable for switching mode amplifiers and also includes the amplitude variation. An implementation of a BPDSM such as described by A. Jayaraman in "Linear High-Efficiency Microwave Power Amplifiers Using Bandpass Delta-Sigma Modulators," *IEEE Microwave and Guided Wave Letters*, Vol. 8, No. 3, March 1998, uses a cascade of an analog modulator, a delta-sigma modulator, a switching mode power amplifier (PA) and a bandpass filter. The implementation of a BPDSM is similar to that shown in FIG. 3 except that the pulse width modulator PWM 18 has been replaced by a bandpass type of delta-sigma modulator and the lowpass filter 22 by a bandpass filter.

One drawback of delta-sigma modulation compared to analog pulse width modulation is that the width of pulses is discreted causing quantization noise. An advantage is that the quantization noise spectral density can be shaped so that it is concentrated outside the signal band and therefore can be filtered away without affecting the signal content.

SUMMARY OF THE INVENTION

It is therefore a specific object of the present invention to generate a variable envelope modulated signal that overcomes the problems of currently known modulation methods and apparatus.

It is a further object of the present invention to use a switching mode power amplifier to improve the transmitter efficiency over that of the Class-AB amplifiers currently used.

It is a yet further object of the present invention to provide a switching mode power amplifier and method that can be used for a variable envelope modulation as well as for a constant envelope modulation.

In a first aspect of the invention, a transmitter includes a modulator with I- and Q-inputs wherein I- and Q-signals present so called in-phase and quadrature-phase components of the modulation signal. The modulator is divided into three portions, namely, a low-frequency portion, a high-frequency RF portion and a local oscillator for generating the bandpass signals. A balanced switching mode power amplifier is coupled to the modulator output to amplify the bandpass signals. A balanced coupling circuit means delivers the amplified bandpass signals to a load.

Preferably, the modulator low-frequency portion includes means for determining the amplitude and phase information content encoded in IQ-signals.

Preferably, the amplitude information content signal and the phase information content signal are encoded as two-state signals.

Preferably, the amplitude and phase information content signals are encoded as pulse width modulated (PWM) signals or as pulse position modulated (PPM) signals.

Preferably, the balanced switching mode power amplifier is configured as two Class-D amplifiers.

Preferably, the local oscillator and the modulator high-frequency RF portion are configured as a phase modulator and generate a substantially sinusoidal RF frequency signal having phase information corresponding to the IQ-input signals. A comparator receives the RF frequency signal and an amplitude-related signal having amplitude information corresponding to the IQ-input signals to generate a bandpass pulse width modulation (BP-PWM) signal.

Preferably, a stabilization feedback loop is connected in series between the output of the phase modulator and the amplitude information determining means.

Preferably, the modulator is an analog modulator having two phase modulators connected to the phase information determining means and amplitude information determining means wherein the total phase difference between the output of the first and second phase modulators is equal to π corresponding to fully differential output signals (and a subtractor should be used at RF; if it is 0, a summer is expected at RF. In both cases the values are valid without modulation).

Preferably, the modulator is a digital modulator and is divided into a slow frequency part for determining the phase and amplitude information content of the Q-input and I-input signals, respectively, and a high frequency part for generating a bandpass pulse position modulation (BP-PPM) signal. In one of many possible arrangements, the digital modulator also includes a digital local oscillator configured from an N-bit wide phase accumulator with a clock input and an increment equal to M wherein the clock frequency $f_c$ is related to the desired modulator output frequency by the relationship $$f_c = \frac{2^N}{M} f_o.$$

Preferably, the modulator is a digital modulator and is divided into a slow frequency part for determining the phase and amplitude information content of the I-input and Q-input signals, respectively, and a high frequency part for generating a bandpass pulse position modulation (BP-PPM) signal. The digital modulator also includes a digital local oscillator configured as a ROM-based state machine and digital adders coupled to the digital local oscillator and the phase and amplitude information content determining means for generating the BP-PPM modulation signal.

Preferably, the phase and amplitude information content determining means are look-up tables in ROM to increase signal-processing speed.

Preferably, the modulator is a digital modulator and is divided into a slow frequency part for determining the phase and amplitude information of the I-input and Q-input signals, respectively, and a high frequency part for generating a bandpass pulse width modulation (BP-PWM) signal. The digital modulator also includes a digital local oscillator configured as a ROM-based state machine and digital comparators coupled to the digital oscillator and the phase and amplitude information content determining means to generate the BP-PWM modulation signal.

BRIEF DESCRIPTION OF THE DRAWINGS

Other features and advantages of the present invention will be apparent from the following written description and the drawings wherein:

FIG. 9 is a schematic functional block diagram of a general modulator structure embodying the present invention;

FIG. 10 is a schematic functional block diagram of a system for generating bandpass pulse width modulation signals in accordance with the present invention;

DESCRIPTION OF PREFERRED EMBODIMENTS

Turning now to the drawings and considering the invention in further detail, it will be first recognized that a switching mode amplifier that is both reliable and preserves its inherent good efficiency must be controlled using two-state signals. The two-state input signal is typically a square wave, where the pulse period is T=1/f and the frequency, f of which is equal to the desired RF-frequency. Generally speaking, a switching mode amplifier does not cause significant phase distortion, but due to its two-state behavior, it is very nonlinear as to the amplitude and can be compared to a one-bit quantizer. Thus, the input signal to a switching mode amplifier must be processed in such a way that no phase or amplitude information is embedded in the amplitude of the input signal. Consequently, both phase and amplitude information is coded in the transition times of a pulse train used as the input signal information.

One coding approach divides the modulation into its respective phase and amplitude parts, and then uses the phase part in any of a number of known methods to generate a phase modulated constant envelope signal. The amplitude part can then be added by either controlling the widths of the pulses or by shifting the positive and negative pulses with respect to each other. The first method is referred to as "pulse width modulation" (PWM), and the latter method is referred to as "pulse position modulation" (PPM). Regardless of the method used, care must be taken to avoid introducing any additional phase modulation.

Figure 1:
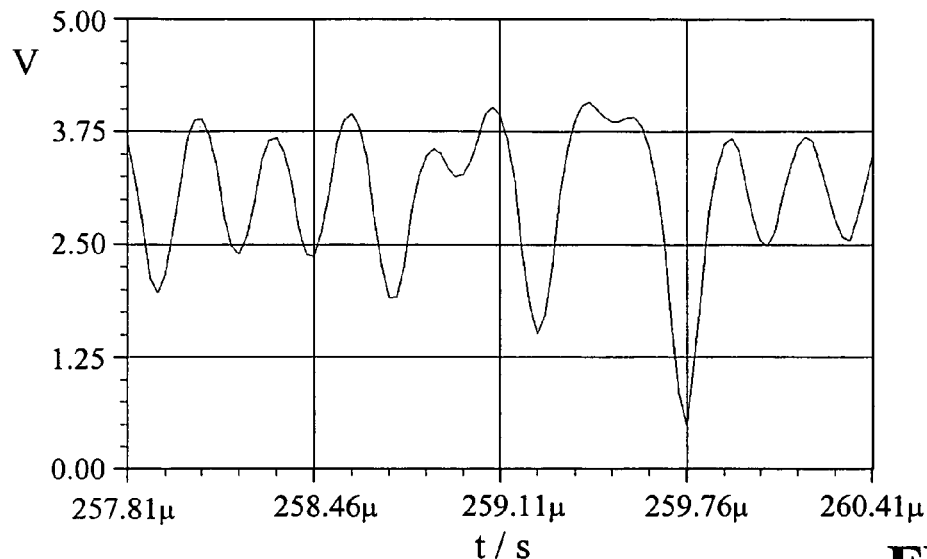
FIG. 1 is a waveform representation of a modulated signal envelope for a QPSK modulator.
Figure 2:
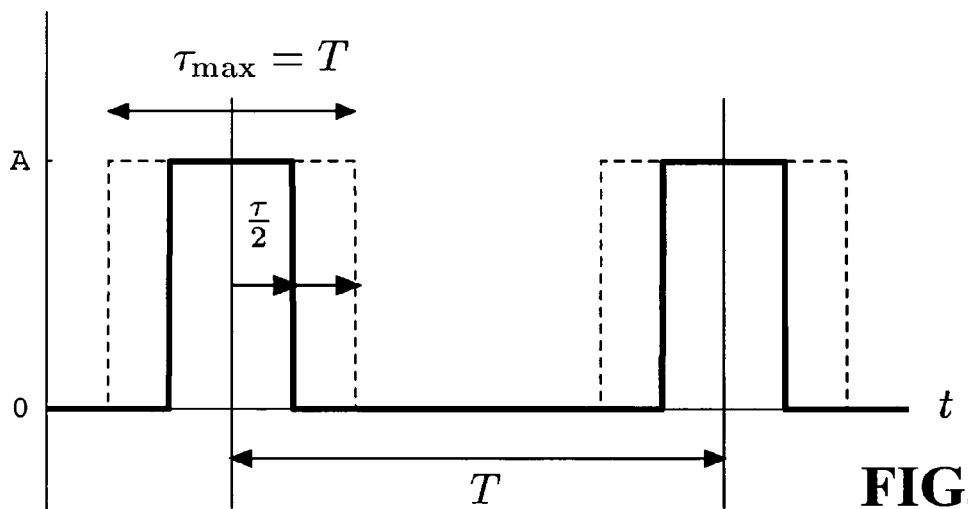
FIG. 2 is a schematic waveform representation of a pulse width modulated signal.
Figure 3:
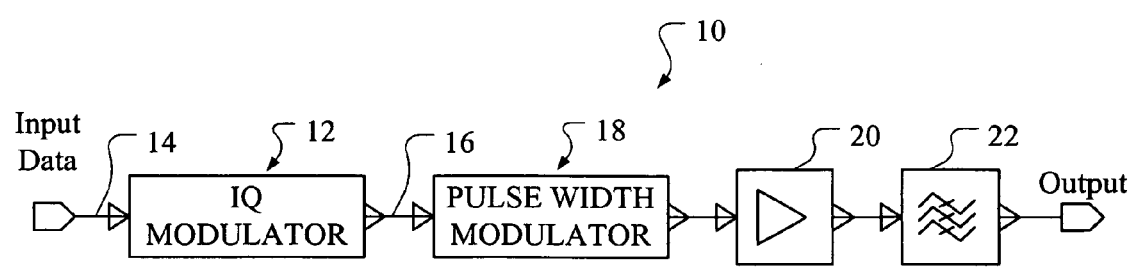
FIG. 3 is a schematic functional block diagram of a transmitter having a pulse width modulator and non-linear amplifier.
Figure 4:
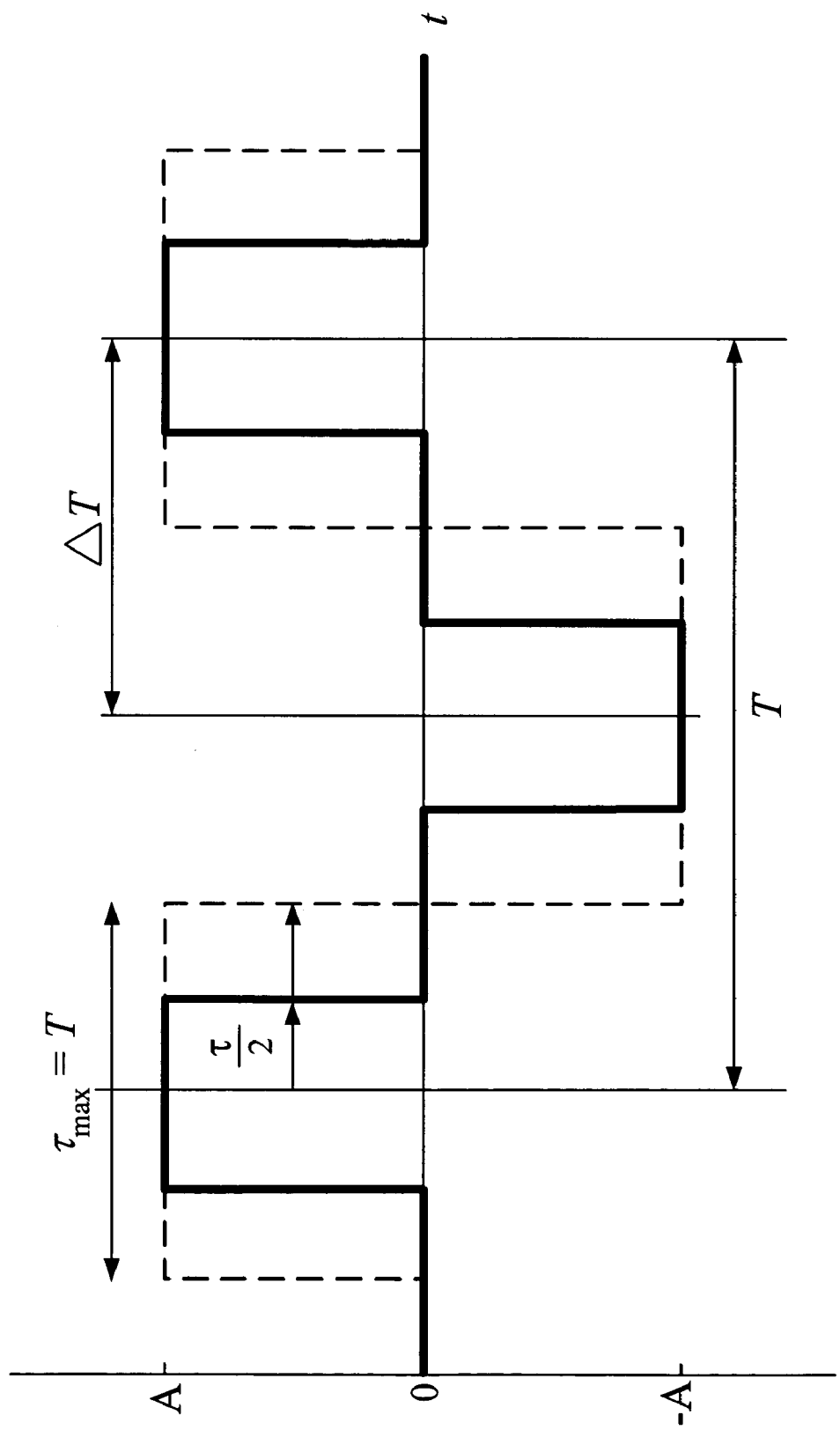
FIG. 4 shows the pulse width amplitude-coding scheme for a bandpass pulse width modulated square wave.
Figure 5:
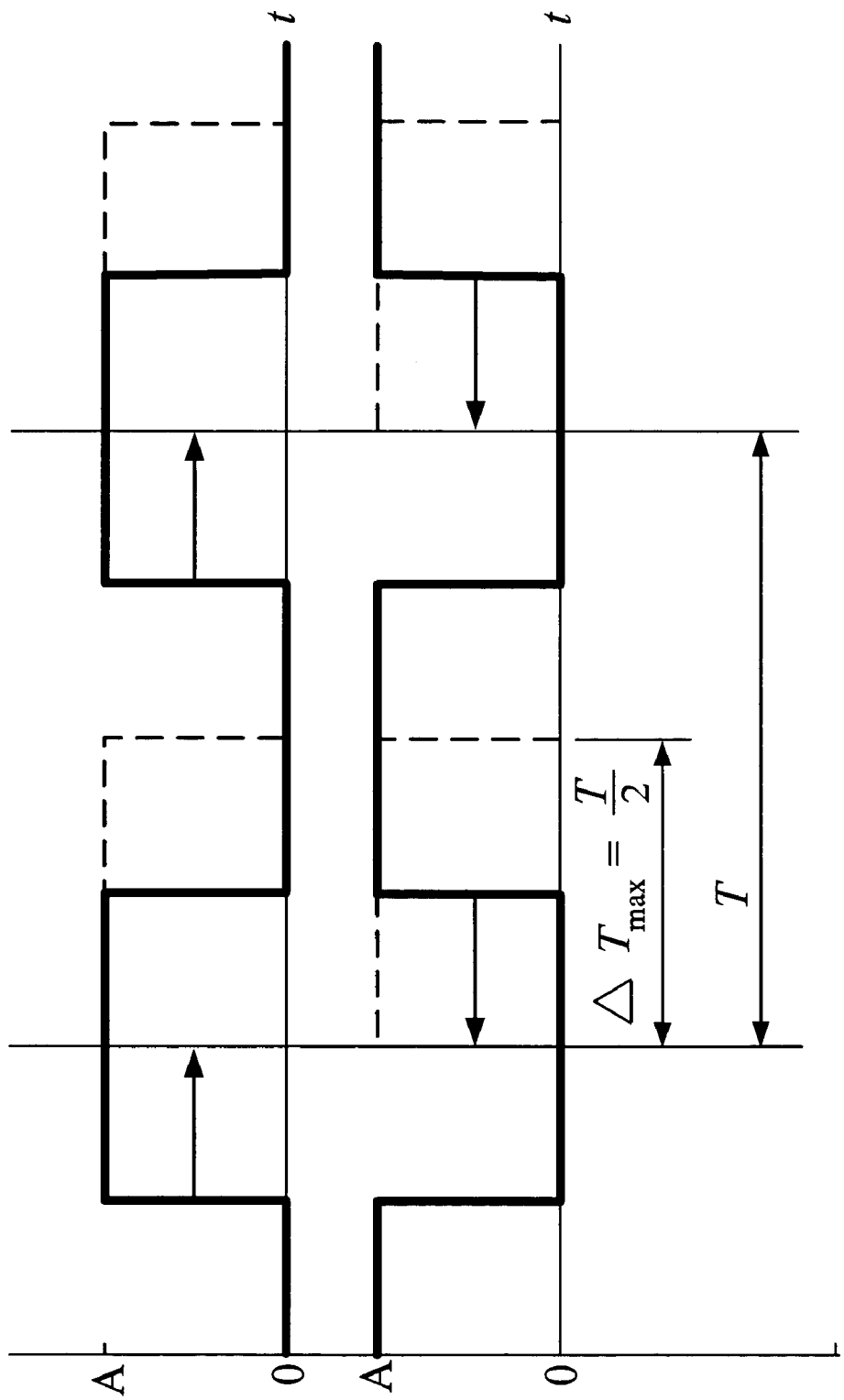
FIG. 5 shows the pulse position amplitude-coding scheme for a bandpass pulse position modulated square wave.

Turning now to FIG. 4, the coding scheme for Bandpass Pulse Width Modulation (BP-PWM) is described wherein the original pulse period is designated T, the width of the pulses is designated τ. The coding scheme for Bandpass Pulse Position Modulation (BP-PPM) is shown in further detail in FIG. 5, where the amplitude information is coded in the time difference of the two pulse trains, ΔT. The amplitude of the $n^{th}$ harmonic of the (almost) periodic signal that includes both PWM and PPM can be calculated by Equation 1:

$$h_n(t) = \frac{4}{n\pi}\sin\left(\frac{n\pi\tau}{T}\right)\sin\left(\frac{n\pi\Delta T}{T}\right)\cos\left(n\frac{2\pi}{T}t\right) \qquad \text{Equation 1}$$

As can be seen, both the pulse width in PWM and the time difference in PPM have a similar non-linear effect on the amplitude of each harmonic. The maximum amplitude for odd harmonics is given for τ=T/2 and ΔT=T/2, and these values produce zero amplitude for even harmonics.

Prior to continuing, it is useful to note the differences between traditional pulse width modulation, or baseband PWM (BB-PWM), and bandpass PWM (BP-PWM), namely, BB-PWM codes an arbitrary signal momentary value, whereas BP-PWM assumes that the signal is a modulated carrier and codes its phase and amplitude information separately. As a consequence, a linear modulator must be used to generate the desired modulation before using BB-PWM; the maximum pulse width in BP-PWM is restricted to T/2, while in BB-PWM it can be equal to T; the mean value of the BP-PWM is zero, while for BB-PWM it is equal to the modulating signal; and the desired output signal in the case of BP-PWM can be extracted by using a bandpass filter that passes the first harmonic only (or more generally speaking, an $n^{th}$ harmonic, n≥1), while a lowpass filter is used for BB-PWM.

The implementation of a BP-PWM system is not straightforward with three-state input signals such as shown in FIG. 4, and therefore it is desirable and advantageous to design an implementation that involves normal two-state logic signals.

Figure 6:
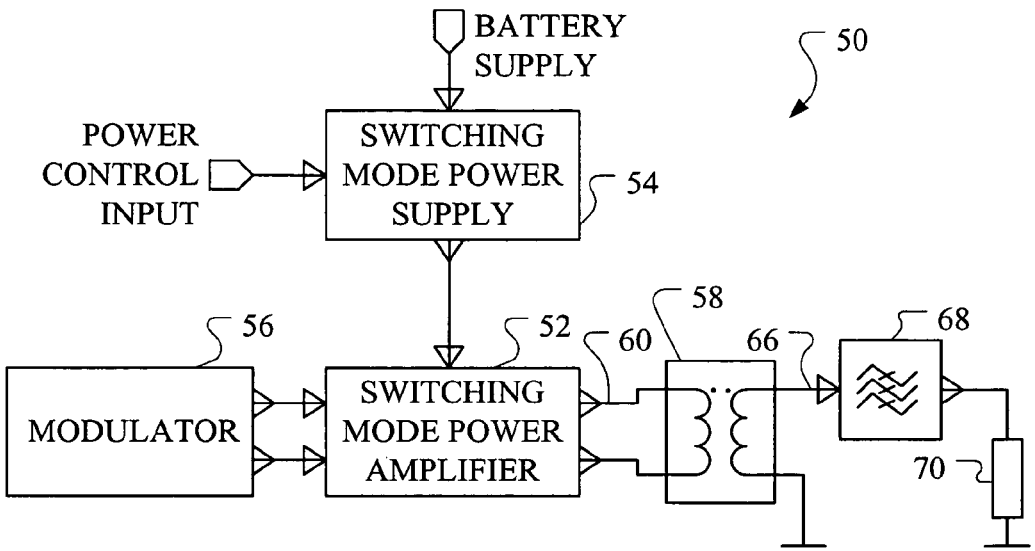
FIG. 6 is a schematic functional block diagram of a general transmitter structure embodying the present invention.

FIG. 6 illustrates a general transmitter structure generally designated 50 that uses two-state logic signals and is of a general configuration in which the present invention may be embodied. The transmitter 50 includes a Switching Mode Power Amplifier (SMPA) generally designated by the function block 52. A Switching Mode Power Supply (SMPS) generally designated by the function block 54 is based on a DC to DC converter design and is used to control the output power of the transmitter as discussed below. The SMPA 52 may be of any now-known amplifier configuration or future-developed amplifiers having operational properties to carry out the intended functions of the present invention. Preferably, SMPA 52 is a high efficiency amplifier design such as Class-D, Class-E and Class-S; however, the invention is not limited to such configurations and may include, for example, Class-C or saturated class-B amplifiers. The modulator function block generally designated 56 embodies the main circuitry corresponding to the PWM or PPM modulation method described for the given embodiment.

Figure 7:
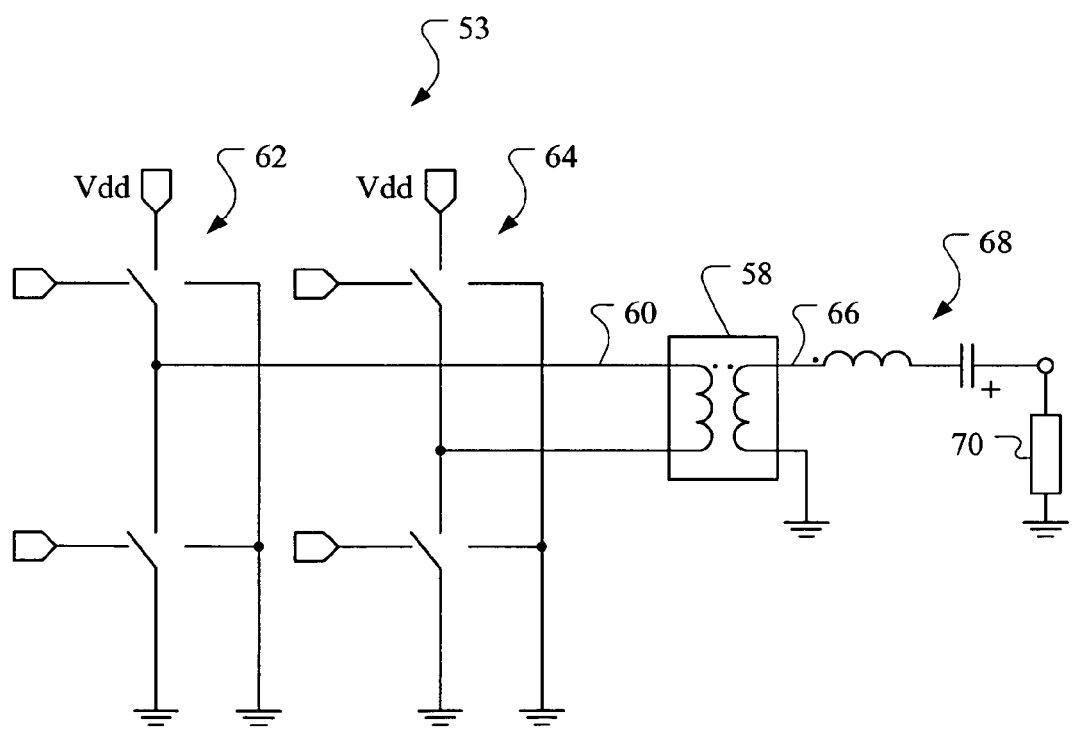
FIG. 7 is a schematic electrical diagram of a balanced switching mode power amplifier based on Class-D amplifier topology.

FIG. 7 illustrates a balanced switching mode power amplifier, generally designated 53, that uses two Class-D amplifiers 62, 64. A balun 58 at the balanced output 60 of the amplifier 53 is implemented by using a transformer. The output 66 of the balun 58 is filtered by a bandpass filter 68 and supplies power to a load 70. The necessary RF-switches in the SMPA 53 are easier to use and present less biasing problems since the switching devices operate as switches rather than amplifiers.

Figure 8:
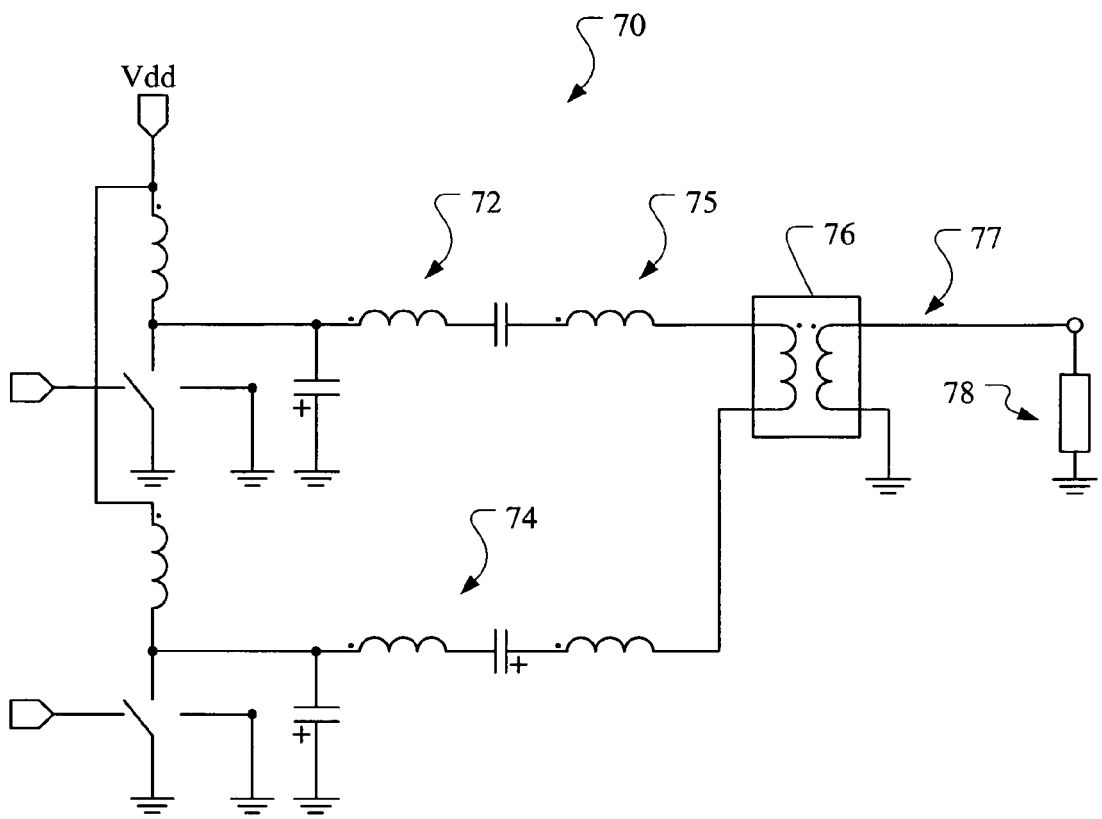
FIG. 8 is a schematic electrical diagram of a balanced switching mode power amplifier based on Class-E amplifier topology.

FIG. 8 illustrates an alternate balanced switching mode power amplifier generally designated 70 that uses two Class-E amplifiers 72, 74. A balun 76 at the output 75 of the amplifier 70 is shown implemented by a transformer. The output 77 of the balun 76 supplies power to a load 78. The reader is referred to textbooks and other literature available in the amplifier art for a description of the operation of Class-D, Class-E and other suitable high efficiency amplifiers.

To facilitate the design and implementation of the transmitter 50 of FIG. 6, the modulator function block 56 is divided into three parts as illustrated in FIG. 9 and are shown as the low-frequency section 80, the RF-section 82 and the local oscillator (LO) section 84. The input I- and Q-signals 86, 88, respectively, are formed as required by the standard in question. The I- and Q-signals 86, 88 are modified suitably in the low-frequency section 80 before forwarding the data at its output 90 into the RF-section 82 in which RF section 82 the selected pulse width modulation or pulse position modulation is carried out. The local oscillator section 84 generates the required RF-frequency at each output channel 92, 94. It will also be recognized that the local oscillator 84 may be incorporated in a modulator sub-block, for example, a phase modulator, as described herein below. The PWM and PPM methods can be implemented using a number of different principles, some of which principles are mostly analog and some almost entirely digital.

First considering an analog modulator using PWM, it is necessary to initially convert the input I- and Q-signals to the corresponding phase and amplitude signals and encode (pre-distort) the amplitude signal in such a way that the whole process is linear, after which a phase modulator is used to generate the final frequency signal with the correct phase information. The final frequency signal, which is substantially sinusoidal, is input to a comparator circuit having a reference level which is determined by an amplitude related signal. FIG. 10 is a functional block diagram of a system 100 for generating bandpass pulse width modulation (BP-PWM) wherein the function block 102 calculates the phase for the phase modulator 104 and the function block 106 calculates the amplitude related level for the comparators 108, 110. With reference to Equation 1, certain amplitude correction processes are needed which are also included in function block 106. The relative level of the envelope is denoted by E, that is, $E = \sqrt{V_I^2 + V_Q^2}$, where $V_I$ and $V_Q$ represent the I- and Q-signals, respectively. Moreover, we assume that E is normalized so that its maximum value is 1. The comparison reference level with the sinusoidal RF-signal is given by Equation 2:

$$V_C = \sin\frac{\pi(1-E')}{2} \quad \text{Equation 2}$$

where E' is a parameter related to E according to Equation 1 above by the relationship shown in Equation 3:

$$E' = \frac{2\arcsin(E)}{\pi} \quad \text{Equation 3}$$

and the coefficient $2/\pi$ is included to preserve the range 0 . . . 1.

Since we want the pulse widths to increase together with E (or E'), 1−E' rather than E' is used in Equation 2. By substituting Equation 3 in Equation 2, the relationship between Vc and E results as shown in Equation 4.

$$V_C = \sin\frac{\pi}{2}\left[1 - \frac{2}{\pi}\arcsin(E)\right] \quad \text{Equation 4}$$
$$= \cos[\arcsin(E)]$$
$$= \sqrt{1 - E^2}$$

The relationship in Equation 4 is used in the comparator reference level calculating function block 106 in FIG. 10, and, consequently, it determines the widths of the output pulses. The other output branch 114 in FIG. 10 uses the same principle as described above but the comparison takes place at the negative half periods of the RF-signal and the comparison level is $-\sqrt{1-E^2}$. Obviously, the pulses are still positive.

Figure 11:
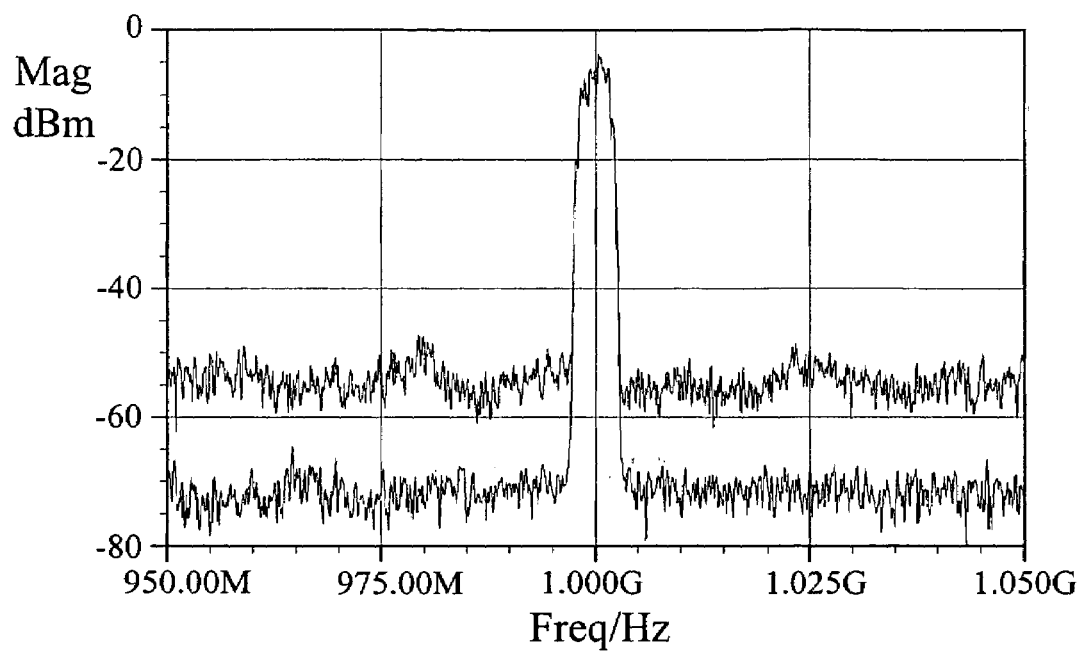
FIG. 11 is a simulated spectrum around the carrier of the analog pulse width modulator of FIG. 10.
Figure 12:
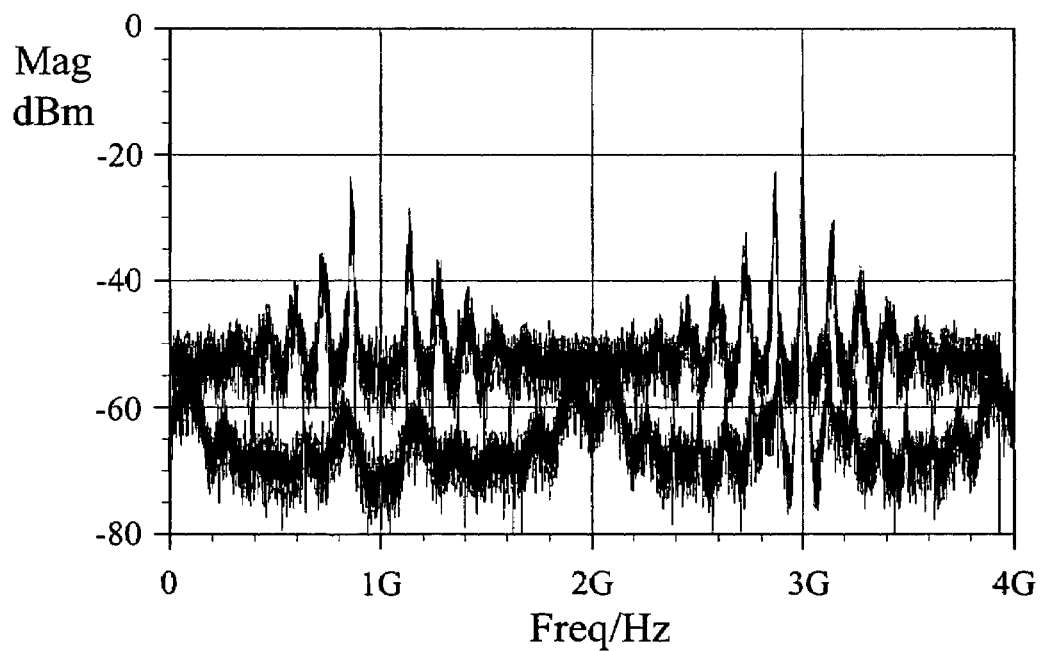
FIG. 12 is a simulated spectrum around the carrier of the analog pulse width modulator of FIG. 10 with wider bandwidth than the simulated spectrum sample rate of FIG. 11.
Figure 13:
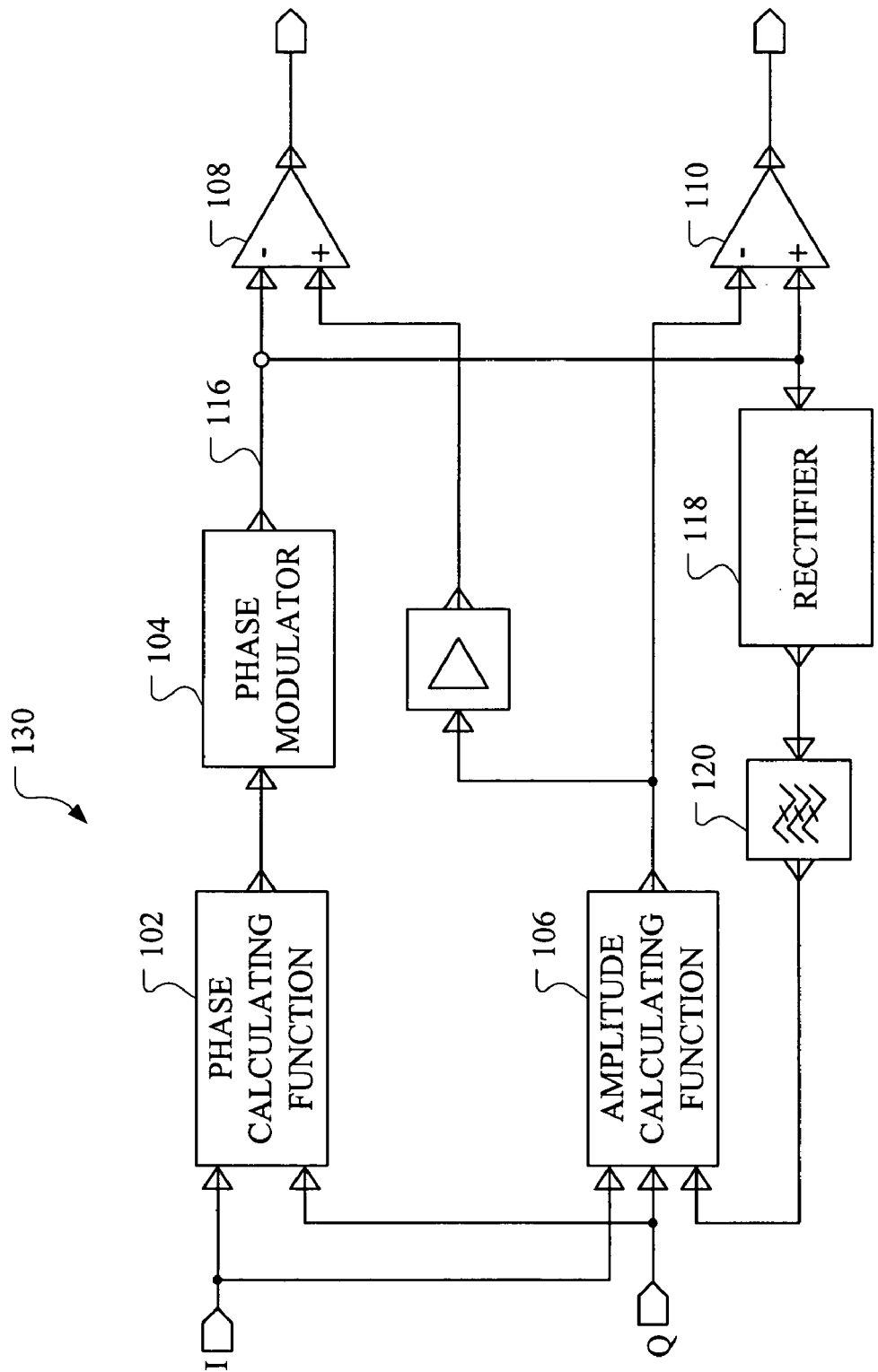
FIG. 13 is a functional block diagram of a system with stabilizing feedback for generating bandpass pulse width modulation signals in accordance with an alternate embodiment of the present invention.

FIGS. 11 and 12 show the simulated spectrum of the above-described modulator shown in FIG. 10 for two different simulated sampling rates. QPSK modulation with 3.84 MHz symbol rate corresponding to the WCDMA specification is used and the difference in the rates is 8. It can be seen from FIG. 11 and FIG. 12 that the higher the sampling rate is, the lower the spectrum noise level. The preceding calculations are based on the assumption that the phase modulator output level is known. Since it is difficult, if not impossible, to predict the output signals accurately in analog systems, a feedback loop can be used to remove the effect of the output level variations. A schematic functional block diagram of a bandpass pulse width modulation system (BP-PWM) with stabilizing feedback is illustrated in FIG. 13 and generally designated 130. The BP-PWM system 130 is similar to that shown in FIG. 10 and like function blocks have like reference numbers. The output 116 of the phase modulator 104 is fed back to the amplitude calculating function block 106 via the rectifier 118 and the lowpass filter 120.

Figure 14:
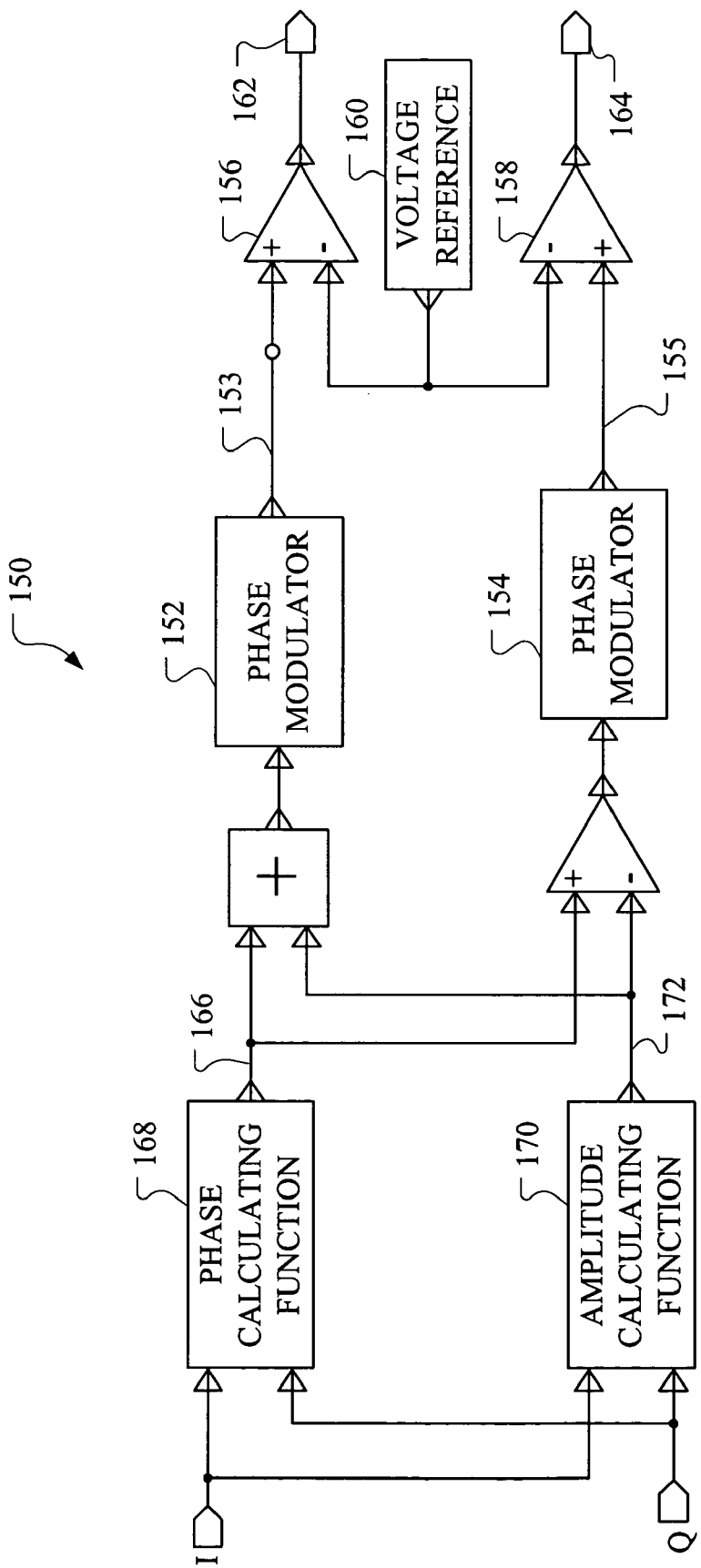
FIG. 14 is a schematic functional block diagram of a system for generating bandpass pulse position modulation signals in accordance with the present invention.

Turning now to FIG. 14, a schematic functional block diagram of an analog modulator using bandpass pulse position modulation (BP-PPM) is illustrated therein and generally designated 150. The pulse position modulation in the modulator 150 in FIG. 14 is generated by including two phase modulators 152 and 154 and two comparators 156 and 158 coupled to the outputs 153, 155 of the phase modulators 152, 154, respectively. The comparators 156, 158 have a common comparison level established by the voltage reference function block 160 that is equal to zero to cause the output 162, 164 to always be a half a period long pulse.

The phase input signal is common to both modulators 152, 154 but the corresponding amplitude signal has an opposite polarity sign. If the envelope, E, has its maximum value (assumed to be 1 here), the corresponding phase shift signal at the output 166 of the phase calculating function block 168 will be arcsin(1)=π/2. Hence, the phase modulator 152 will have a phase shift equal to π/2 and the phase modulator 154 phase shift will be −π/2. The total phase difference between the phase modulators 152, 154 will then be equal to π corresponding to fully differential signals in the output, thereby producing maximum power after the balun. On the other hand, if E=0, the output 172 of the amplitude calculating function block 170 will be zero as well, and the output signals 162, 164 will have the same phase and will cancel in the balun, resulting in a zero output power level. The reader is referred to U.S. Pat. No. 3,777,275 entitled "Linear Amplification With Nonlinear Devices," incorporated herein by reference, for the related equations for PPM used in this disclosure.

Figure 15:
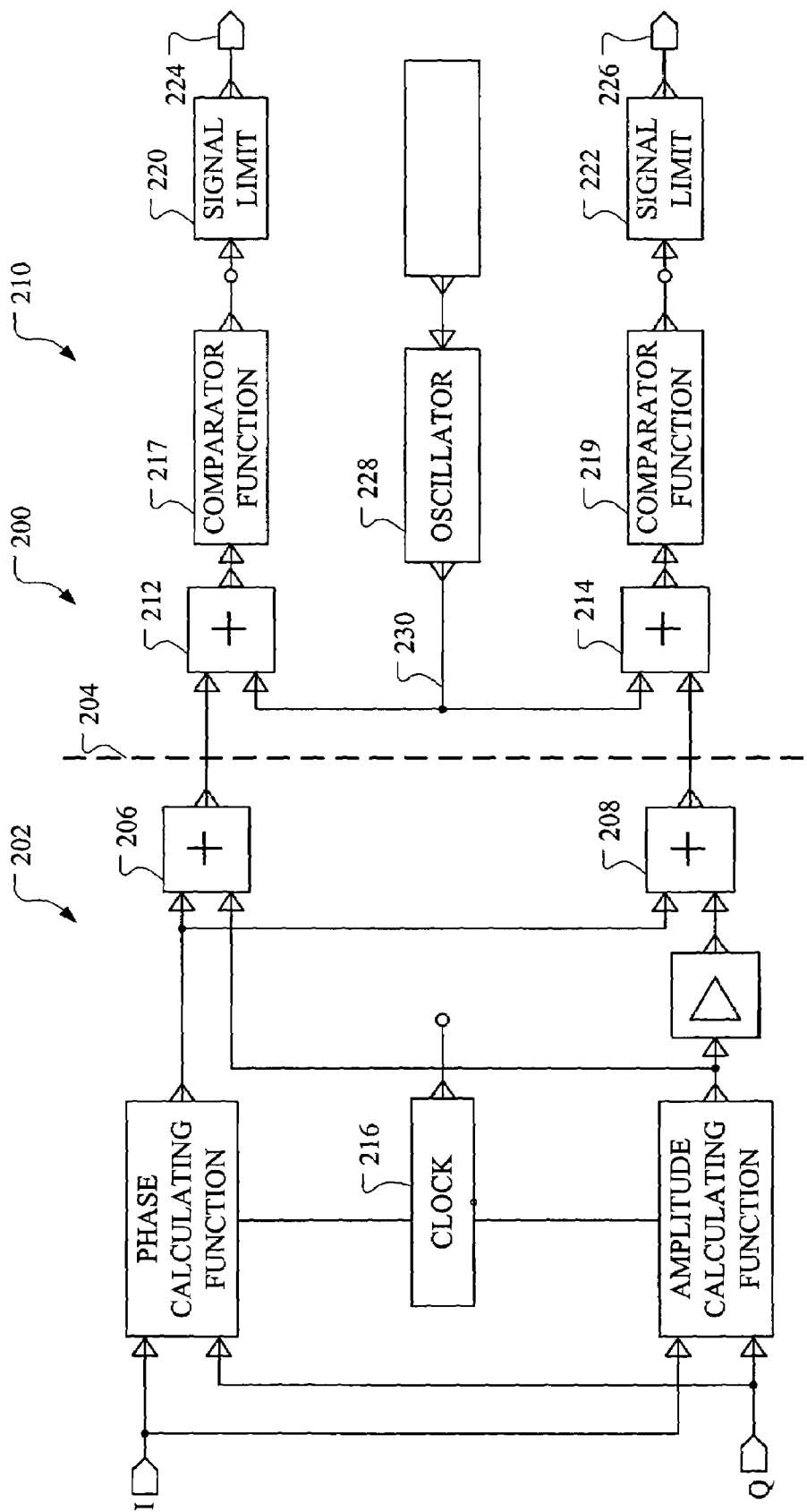
FIG. 15 is a schematic functional block diagram of the system of FIG. 14 implemented without explicit phase modulators.
Figure 16:
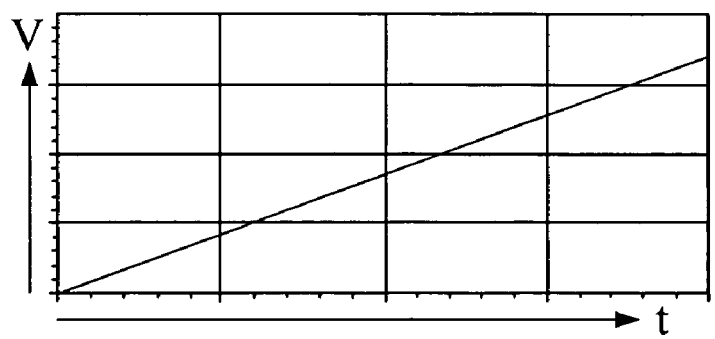
FIG. 16 is the oscillator output voltage waveform of the pulse position modulator of FIG. 15.
Figure 17:
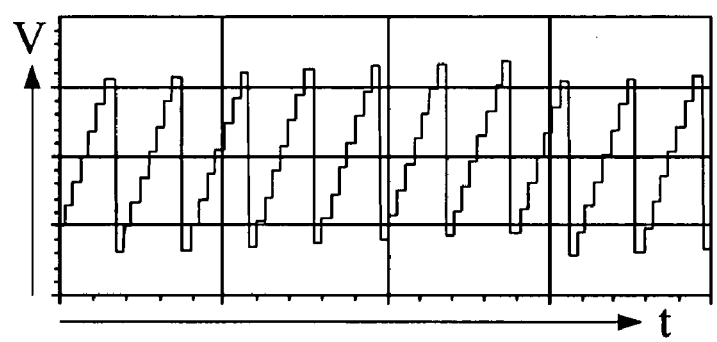
FIG. 17 is the voltage waveform at the output of the comparator function block of the pulse position modulator of FIG. 15.
Figure 18:
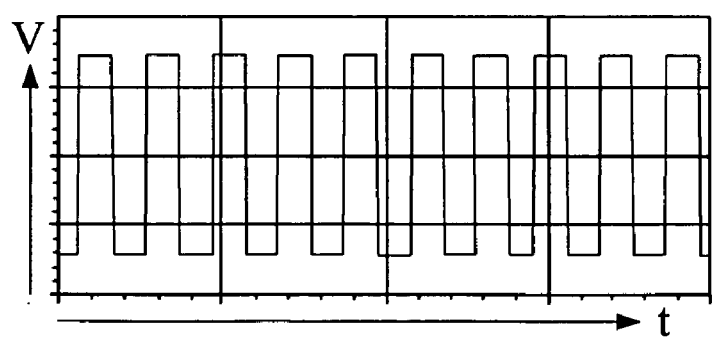
FIG. 18 is the voltage waveform at the output of the pulse position modulator of FIG. 15.

Turning now to FIG. 15, a schematic functional block diagram of a digital modulator implemented with pulse position modulation is illustrated therein and generally designated 200. The modulator illustrated in FIG. 14 can be modified to the form shown in FIG. 15 by assuming that very high frequency digital signal processing can be used. FIG. 15 is divided into two parts: a slow frequency part generally designated 202 is shown on the left of the dash line 204 and includes two summers 206 and 208; a high frequency part generally designated 210 is shown on the right side of the dash line 204 and also includes two summers 212 and 214. A separate clock represented by the clock function block 216 is added to synchronize the phase and amplitude component computation in the low frequency part 202. The phase modulators 152, 154 of FIG. 14 have been substituted by a linear ramp functioning as an oscillator as represented by the oscillator function block 228, two summers 212, 214 that take in the modulation and two function blocks 217, 219 that restrict the output signal 224,226 using modulo 1 function. The ramp voltage output signal 230 is shown in FIG. 16. The output signal 224, 226 is illustrated in FIG. 18. Moreover, the function of the comparators 156, 158 of FIG. 14 is now represented by function blocks 220, 222 in FIG. 15. The output signal of the comparator function blocks 217, 219 is illustrated in FIG. 17.

Figure 19:
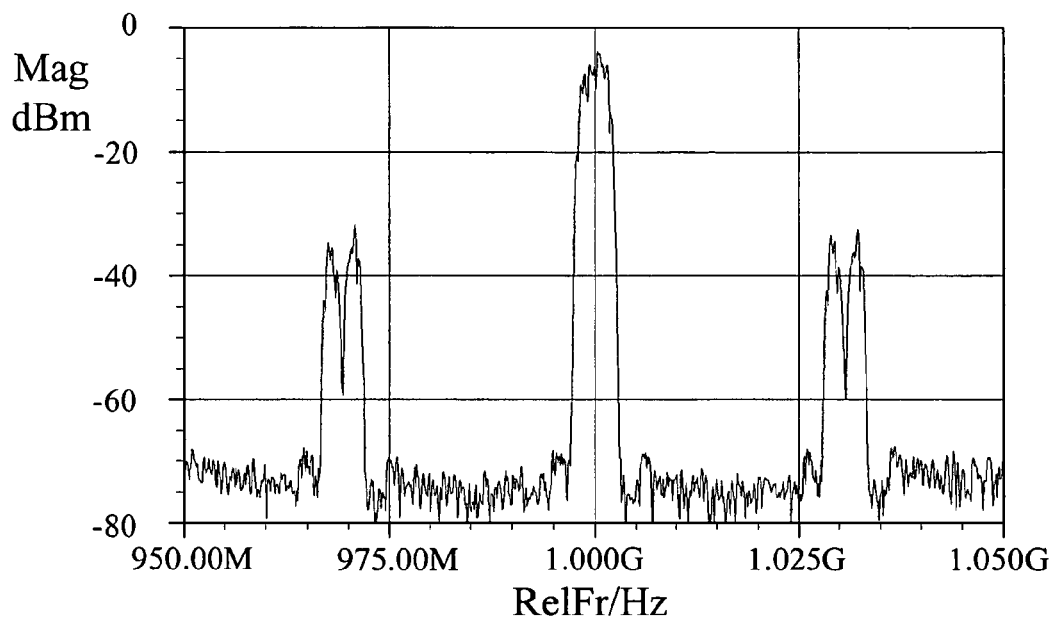
FIG. 19 is a simulated spectrum around the carrier of the pulse position modulator of FIG. 15.

The simulated spectrum for the BP-PPM system of FIG. 15 is shown in FIG. 19. The most distinct difference compared to the spectrum of FIG. 11 is due to the replicas or lobes of the spectrum on both sides of the desired spectrum. The distance of the replicas from the center is determined by the fact that over-sampling ratio OSR 8 is used in the low frequency part 202, where the sampling rate there is 8×3.84 MHz=30.72 MHz.

The oscillator function block 228 in FIG. 15 fulfills the relationship $V_{Out_i} = V_{Out_{(i-1)}} + V_i$, where index i refers to the time i$\Delta$t. Since the input to the ramp generator block 228 is continuously constant f$\Delta$t, the output voltage 230 will be if$\Delta$t. The effect of the calculated phase modulation is added in this cumulating phase and the modulo 1 function is used because the total phase value of the original sinusoidal signal also follows a similar relationship. The difference is that in the case of a sinusoidal signal we effectively use modulo 2$\pi$ instead of modulo 1, and in FIG. 15 all related signals are divided by 2$\pi$ to move the calculation burden from the high frequency part 210 to the low frequency part 202.

Figure 20:
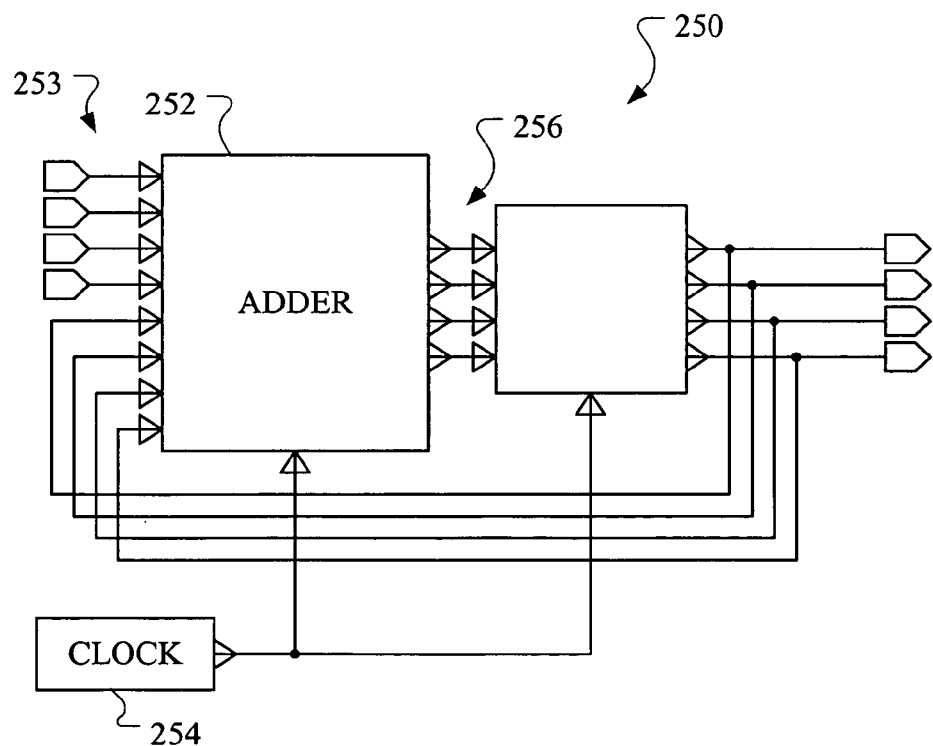
FIG. 20 is a schematic functional block diagram of a local oscillator that may be utilized in the pulse width and pulse position modulators of FIGS. 10, 13, 14 and 15.

The above-described operation of FIG. 15 can be implemented digitally as an oscillator generally designated 250 in FIG. 20 that uses a phase accumulator similar to that in direct digital synthesis (DDS) for example. The phase accumulator can be made by using a digital adder 252 as shown in FIG. 20. However, the look-up-table and DAC (digital-to-analog) converter portions of the DDS are not required. The numerical values in the example are chosen to make the output frequency 1 GHz. When the accumulator uses 16 bits and the accumulator input 253 word (increment) is 5000, a step of 1 in the input word corresponds to a 200 kHz change in the output frequency, which requires a 13.1072 GHz clock 254 to do so. Of the 16 output bits of the accumulator, the eight most significant bits are directed forward in order to make the implementation of the remaining portion of the modulator more feasible. It should be noted that only a four-bit accumulator (instead of 16-bit accumulator) is used for simplicity of presentation in FIG. 20.

Figure 21:
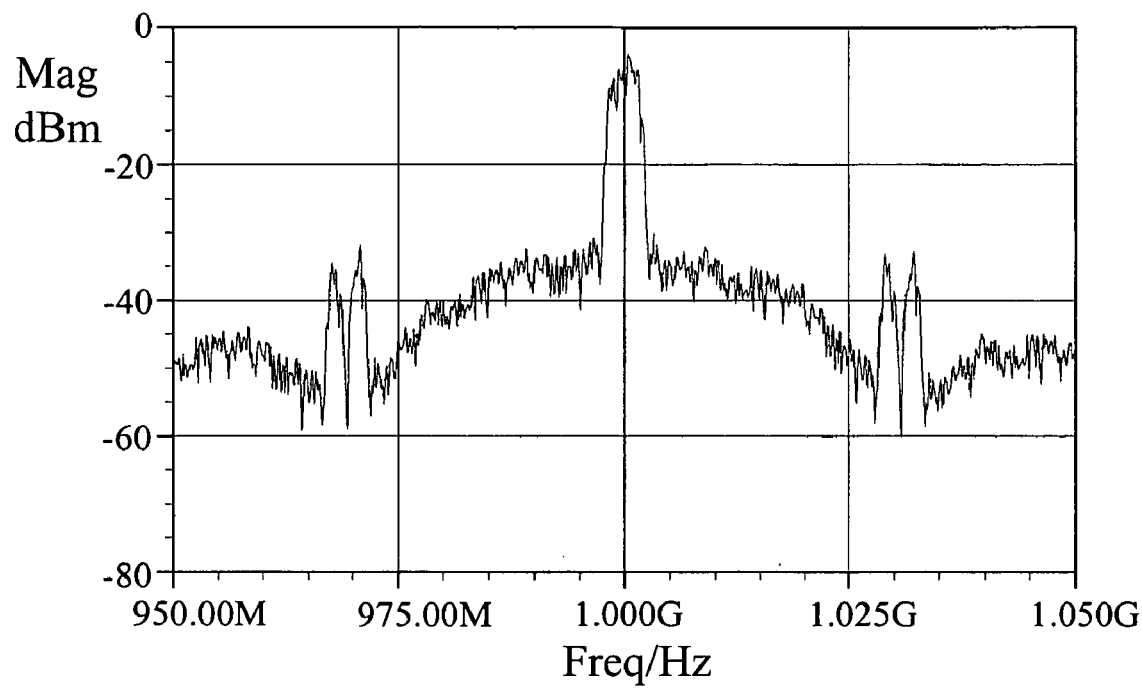
FIG. 21 is a simulated spectrum around the carrier of the pulse position modulator of FIG. 15 utilizing the local oscillator of FIG. 20 implemented with a four-bit accumulator and 16 GHz clock frequency.
Figure 22:
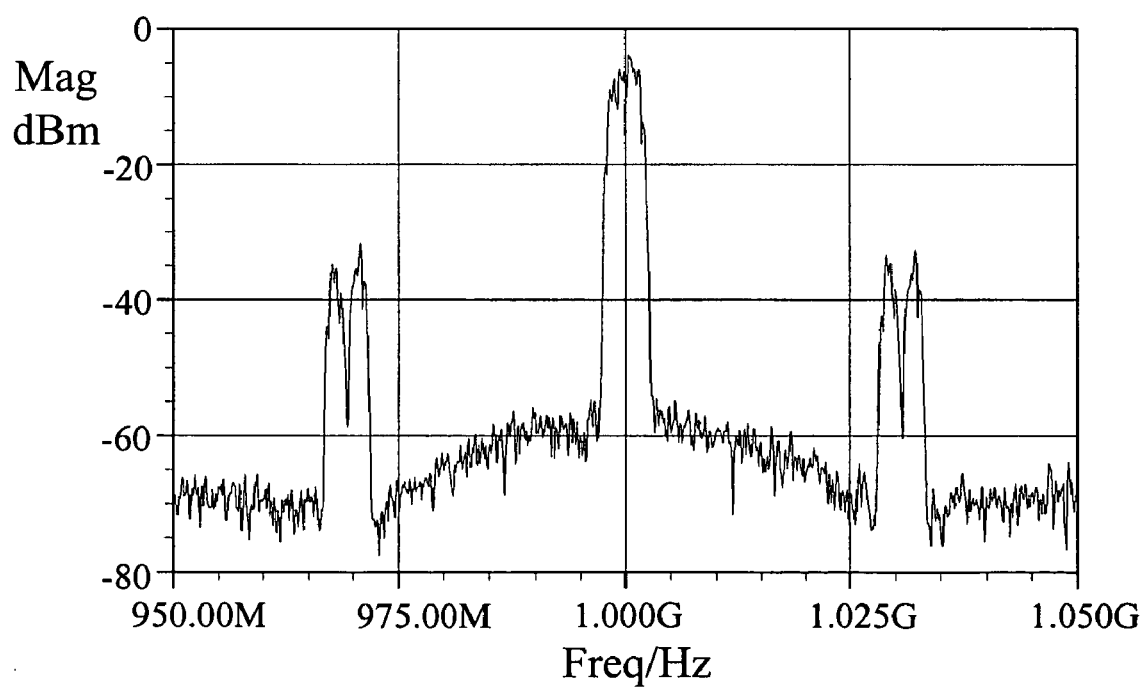
FIG. 22 is a simulated spectrum around the carrier of the pulse position modulator of FIG. 15 utilizing the local oscillator of FIG. 20 implemented with an eight-bit accumulator and 256 GHz clock frequency.

The above discussion of the phase accumulator based digital local oscillator implementation shown in FIG. 20 is based on a fixed clock frequency. If the clock frequency is allowed to change, for example through the use of an appropriate phase-locked-loop circuit (PLL), slightly different solutions for the implementation of the modulator of FIG. 20 are possible: In the simplest case, a four-bit accumulator as shown in FIG. 20 can be used wherein the increment is 1. Thus, in order to achieve the 1 Ghz output frequency, the clock frequency must be $2^4 \times 1$ GHz=16 GHz. Since the local oscillator LO-input for the RF-summers as shown in FIG. 15 is eight bits wide, the output 256 of the adder 252 should denote the four most significant bits in the adder input. The four least significant bits can represent any constant, or the four least significant bits can vary to represent any other desired defined relationship. The resultant spectrum corresponding to the digital local oscillator implementation of FIG. 20 in the modulator of FIG. 15 is shown in FIG. 21. We can add the number of bits in the adder 252 up to eight bits, in which case dummy bits are not needed for the adder. The drawback is that the required clock frequency increases and for eight bits the clock frequency will be 256 GHz. The corresponding spectrum for the higher clock frequency at 256 GHz is shown in FIG. 22. It can be seen that increasing the number of the accumulator bits provides a lower noise level for the output signal.

The phase-accumulator-based digital local oscillator implementation described above in connection with FIG. 20 can be generalized by assuming an N-bit wide accumulator, whose increment is equal to M. Then, if the desired modulator output frequency is denoted by $f_o$, the corresponding clock frequency is given by Equation 5:

$$f_c = \frac{2^N}{M} f_o \qquad \text{Equation 5}$$

For example, if a 16 GHz clock and four-bit accumulator is used as in the case of the spectrum shown in FIG. 21, a six-bit accumulator and an increment of four will produce the same spectrum result.

Figure 23:
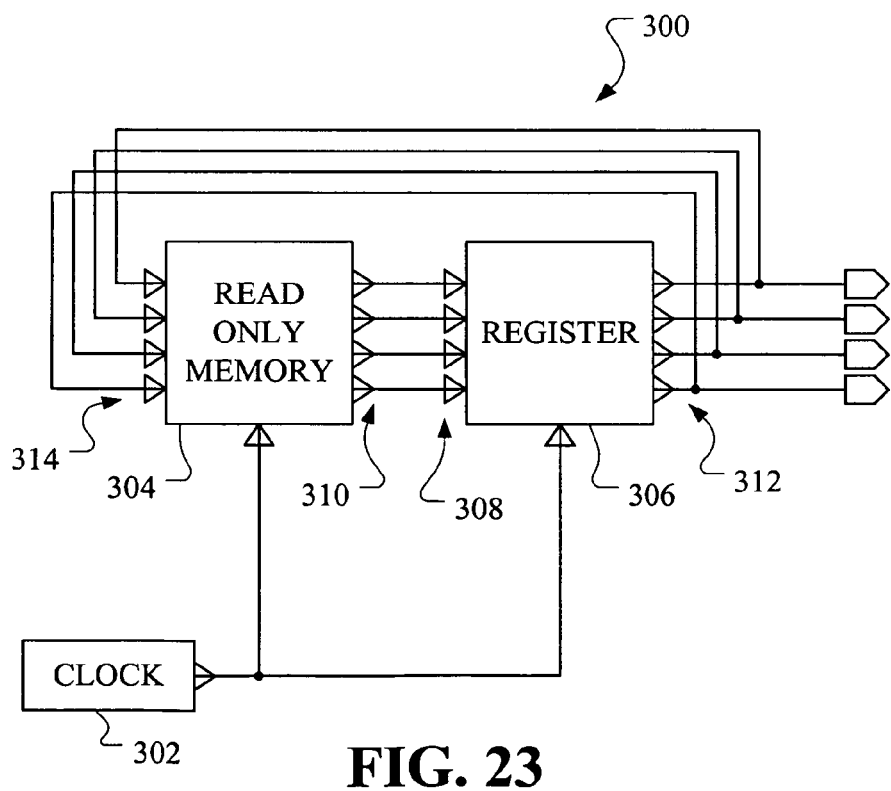
FIG. 23 is a schematic functional block diagram of the local oscillator of FIG. 20 implemented as a ROM-based state machine.

The phase-accumulator-based digital LO-circuit as shown in FIG. 20 in which the increment is constant, can easily be replaced by a ROM-based state machine, such as the one generally designated 300 in FIG. 23, implemented with four-bits. The ROM-based state machine local oscillator 300 includes a clock 302, a ROM 304 and an output register 306 having its input 308 coupled to the output 310 of the ROM 304. The output 312 of the register 306 is coupled to the input 314 of the ROM 304. Because the increment is one, all the outputs 312 can be fed back directly to the inputs 314 of the ROM 304. In this case the content of the ROM 304 is such that for each address value, the output value is address+1 (see Table 1), which provides the desired ramp for the oscillator.

TABLE 1

| Address | Value |
|---------|-------|
| 0 | 1 |
| 1 | 2 |
| 2 | 3 |
| . | . |
| . | . |
| . | . |
| 15 | 0 |

The BP-PPM system of FIG. 15 can be implemented digitally by using the digital ROM-based state machine local oscillator 300 shown in FIG. 23, and the analog summers and the related modulo-functions can be implemented with digital adders. The modulo-function will then be included naturally without any extra operations. The schematic functional block diagram of the resulting fully digital circuitry of the BP-PPM system 200 of FIG. 15 is shown in FIG. 24 and generally designated 350.

Figure 25:
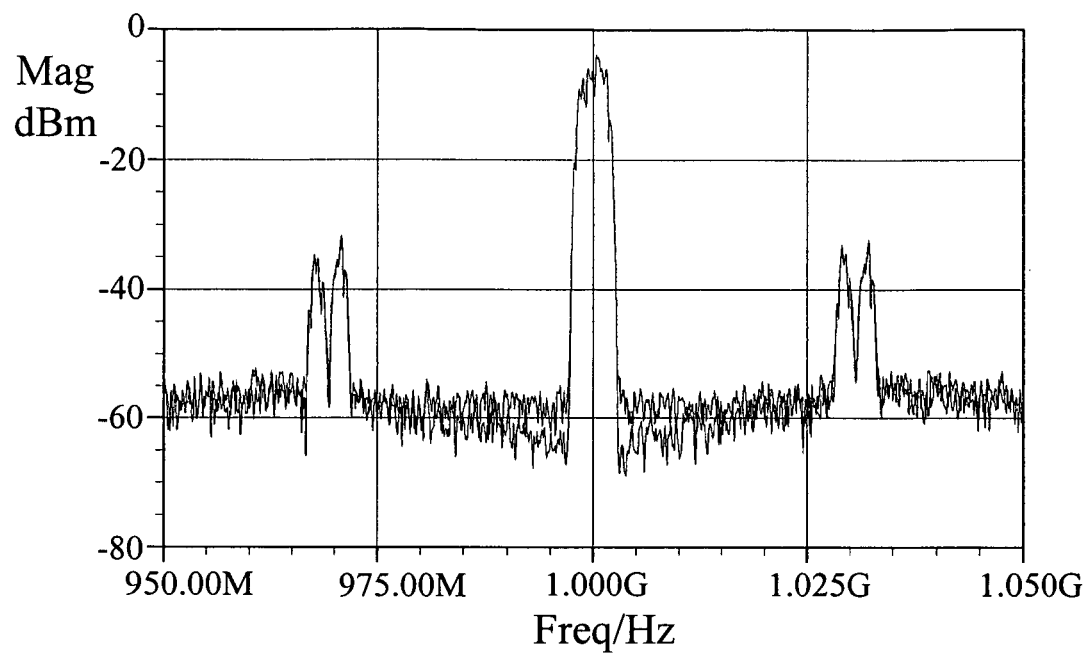
FIG. 25 is a simulated spectrum around the carrier of the digital bandpass pulse position modulator of FIG. 24 having eight digitizing bits.
Figure 26:
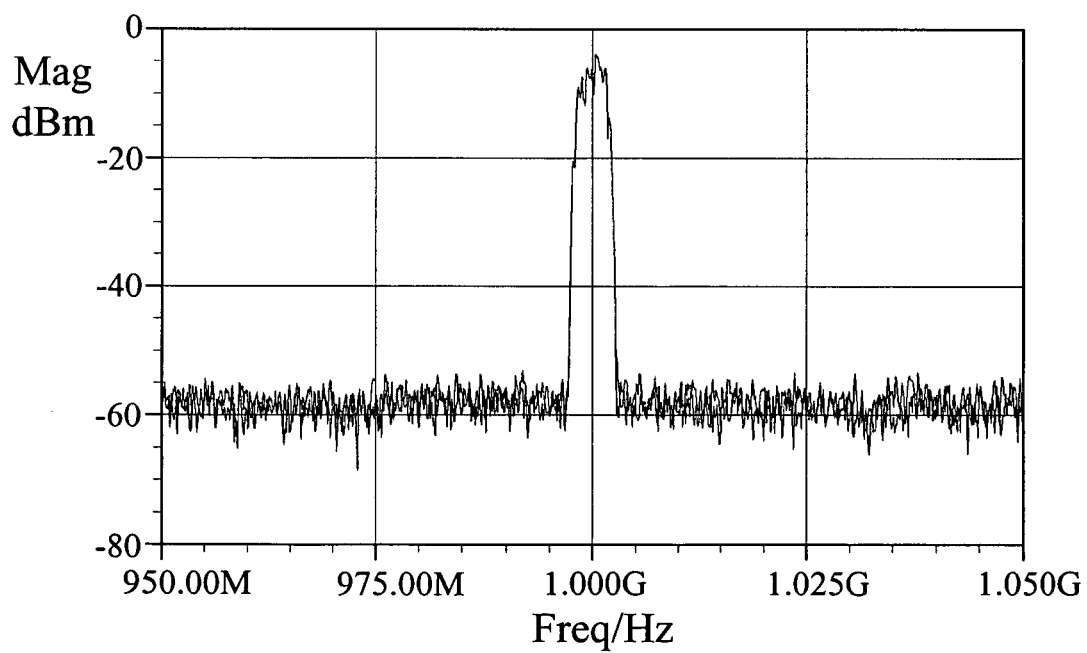
FIG. 26 is a simulated spectrum around the carrier of the digital bandpass pulse position modulator of FIG. 24 having 64 digitizing bits.

The digital BP-PPM system 350 receives I- and Q-input signals that are formed in accordance with the standards used with the given system. Function block 352 calculates the phase component of the input signal and function block 354 calculates the amplitude component of the input signal. The phase and amplitude components of the input signal are coupled to the inputs 356, 358 of the digital adders 360, 362, respectively. The phase input signal is common to both adders 360, 362, but the amplitude signal component provided to adder 360 has a polarity sign different than the polarity sign of the amplitude signal component provided to adder 362 due to the summer 364 and inverter 366, respectively. The local oscillator is similar to the digital ROM-based state machine local oscillator in FIG. 23 and is generally designated 370 in FIG. 24. The local oscillator 370 includes a clock 372, ROM 374 and register 376 and operates in substantially the same manner as described above in connection with the description of the digital ROM-based state machine local oscillator of FIG. 23. The simulated spectrum of a fully digital pulse position modulator (BP-PPM) system of FIG. 24 is illustrated in FIGS. 25 and 26, wherein the over-sampling ratio (OSR) in the low frequency portion is 8 for FIGS. 25 and 12 for FIG. 26. As can be seen from the simulated spectrum shown in FIG. 26 corresponding to the fully digitally implemented BP-PPM system in FIG. 24, the side lobes can be moved further away by increasing the OSR.

Figure 24:
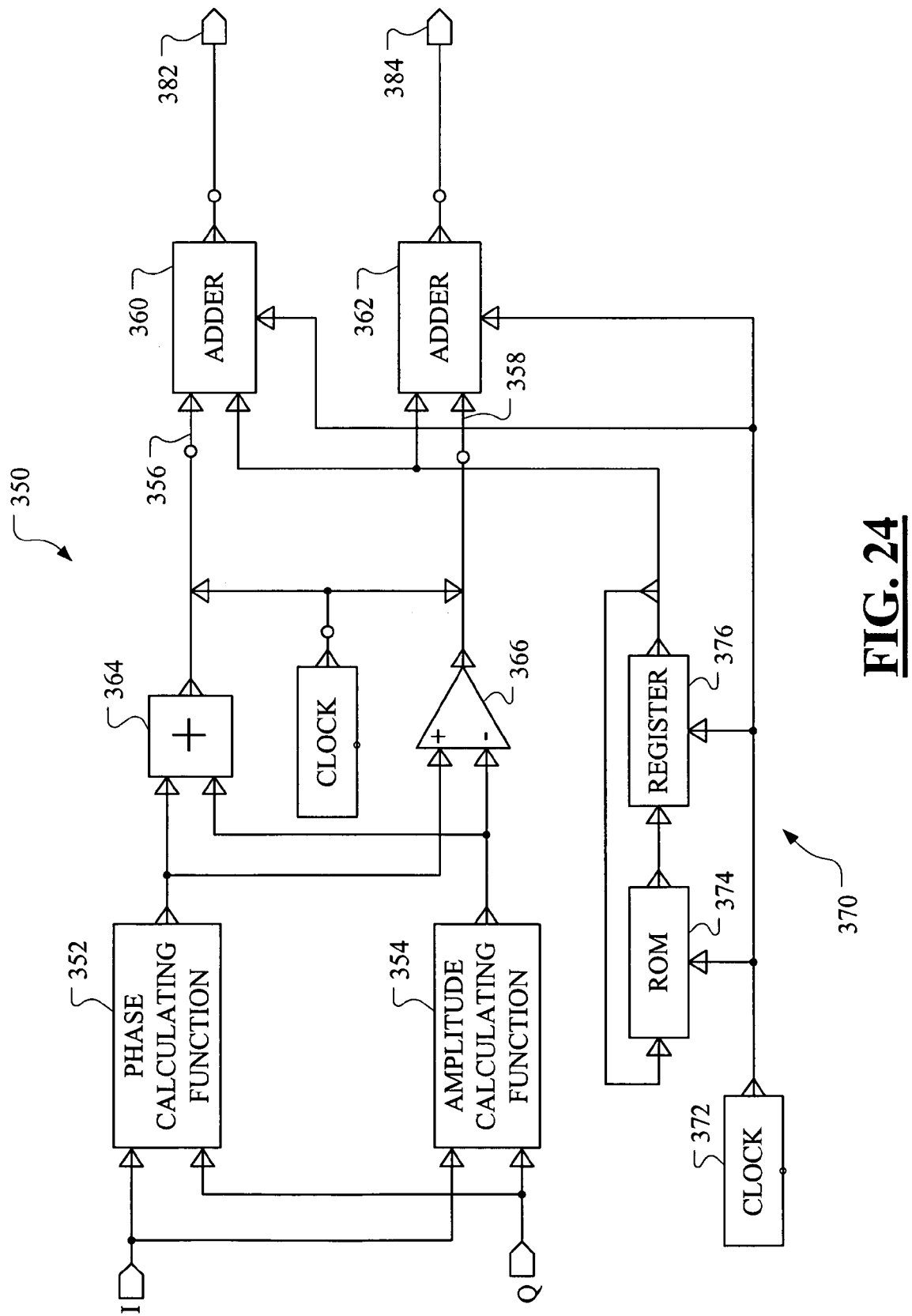
FIG. 24 is a schematic functional block diagram of a digital bandpass pulse position modulator.
Figure 27:
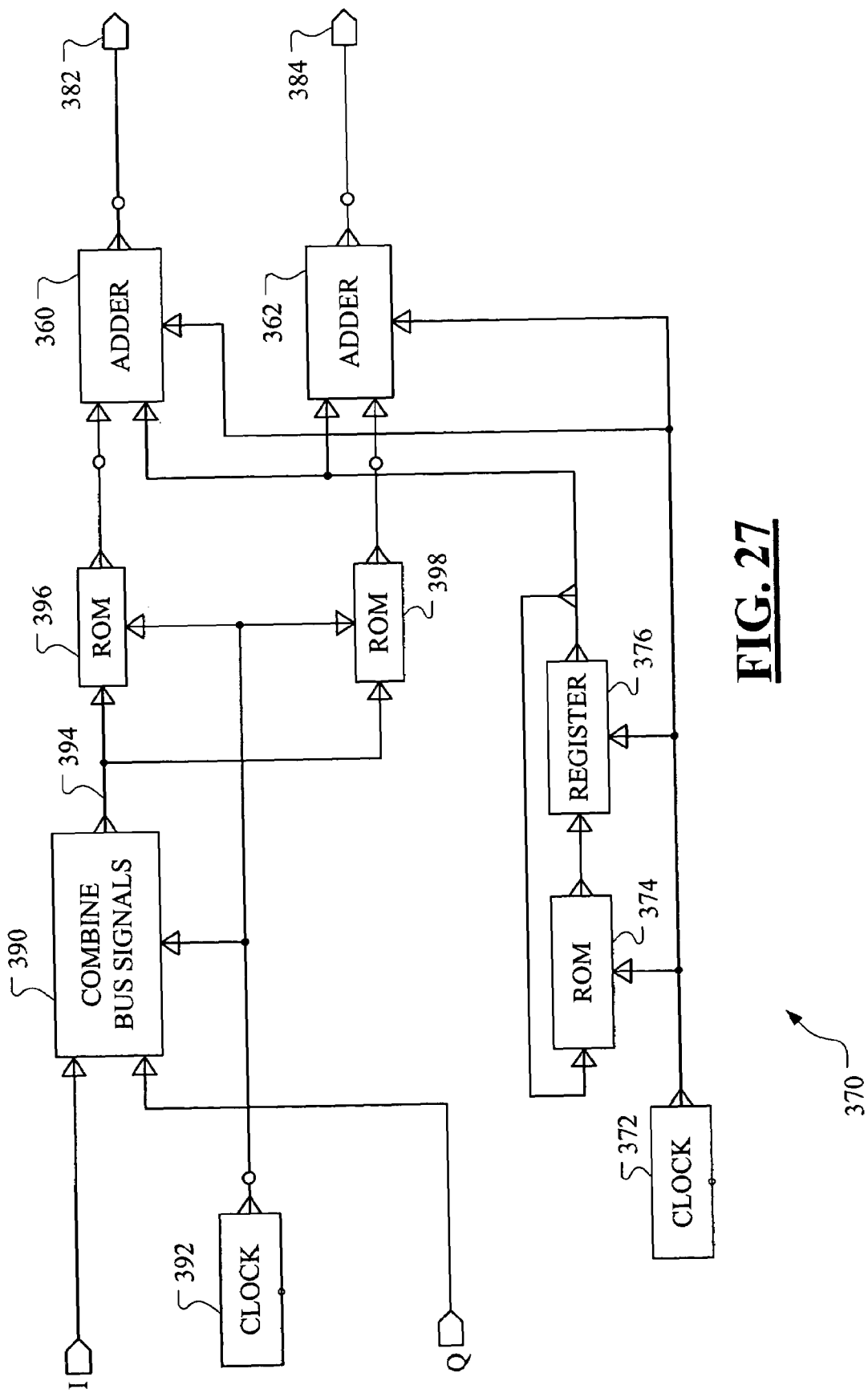
FIG. 27 is a schematic functional block diagram of the digital bandpass pulse position modulator of FIG. 24 implemented with ROM look-up tables for the low frequency calculation function.

The BP-PPM functional block diagram system 350 shown in FIG. 24 can be further modified, to use look-up tables in ROMs 396, 398 as shown in FIG. 27 to increase the speed of the signal processing rather than performing continuous calculations in the low frequency part as described above. Unfortunately, the addressing of the ROMs requires the momentary values of both the I- and Q-signals. Therefore, if eight-bit resolution suffices for the I- and Q-signals separately, the address bus of the ROMs must be 16-bits wide making the required memory area rather large. On the other hand, some of the memory locations will never be used, and, therefore, the actual required memory area is reduced.

The BP-PPM system of FIG. 27 is similar to the one shown and described in connection with FIG. 24 and like reference numbers refer to like parts. The phase and amplitude component calculating functions of FIG. 24 are replaced with look-up tables stored in ROMs 396, 398, respectively. The I- and Q-input signals are input respectively to a bus signal combining function block 390 appropriately synchronized by a timing signal from the clock 392. The combined bus signal output 394 is 16-bits wide and provides the necessary addressing to retrieve the corresponding phase and amplitude values from the look-up tables in the ROMs 396, 398.

Figure 28:
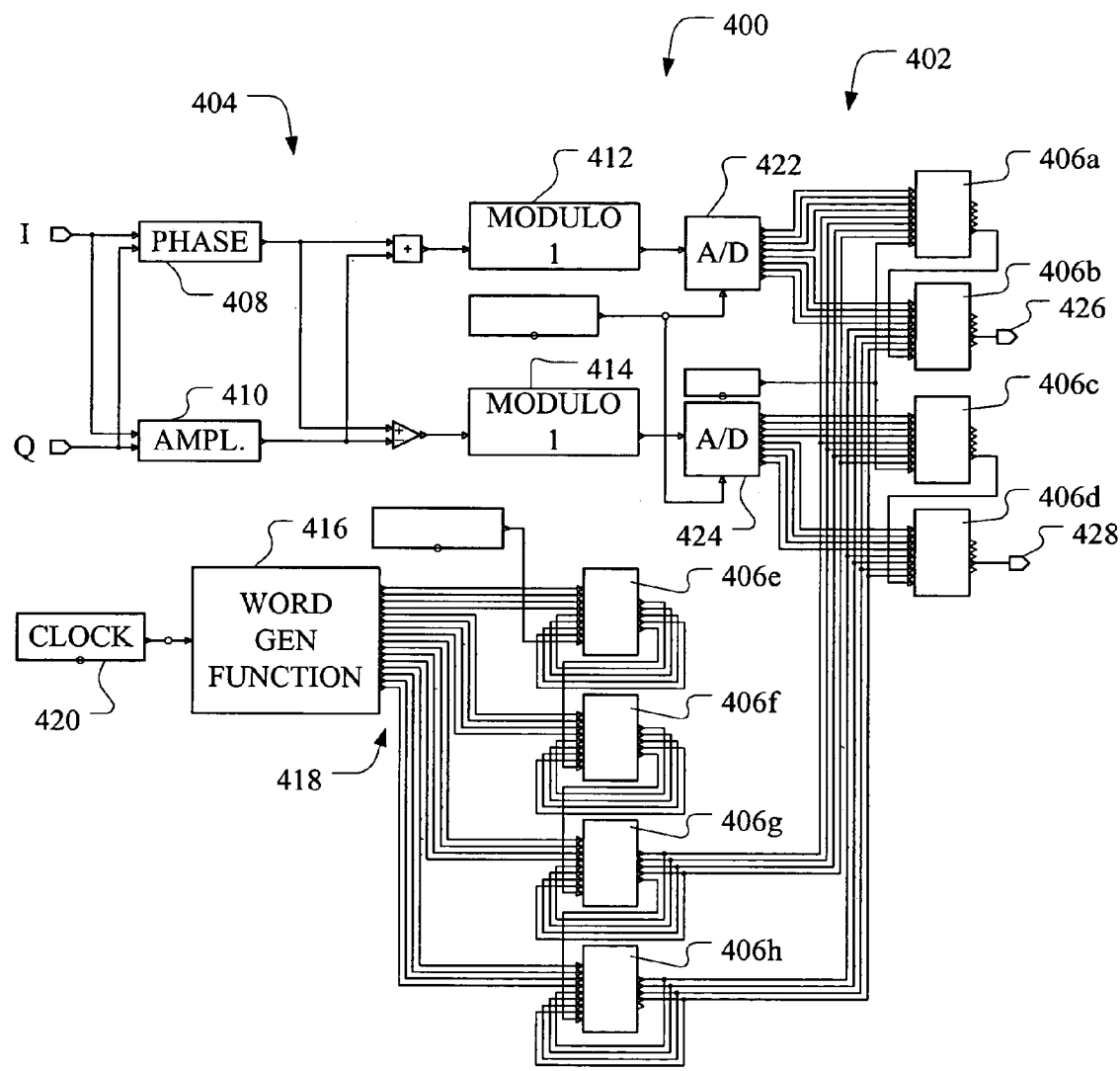
FIG. 28 is a schematic functional block diagram of the digital bandpass pulse position modulator of FIG. 24 implemented with four-bit adders for the high frequency calculation function.

The above-discussed high frequency digital approach using ROM look-up tables shown by the BP-PPM functional block diagram in FIG. 27 can be further clarified by using explicit signals and adders in the schematic functional block diagram in place of the busses. A schematic functional block diagram of a BP-PPM system generally designated 400 with four-bit adders substituted in place of busses is shown in FIG. 28. The high frequency part generally designated 402 has been modified to use the four-bit adders 406a–406h but the low frequency part generally designated 404 is similar to that presented above in connection with FIG. 14.

As discussed above, the I and Q input signals are inputted to the phase component calculating function block 408 and the amplitude component calculating function block 410 which phase and amplitude component signals are coupled to the modulo 1 function blocks 412, 414, respectively in a similar manner as described in conjunction with the description of the functional block diagram in FIG. 14. For purposes of illustration and circuit operation simulation, the frequency is determined by the word generating function block 416 whose output 418 is input to the four-bit adders 406e–406h (comprising a 16-bit phase accumulator) in a timed sequence from the clock 420. The output of the four-bit adders 406g and 406h (the 8 most significant bits of the accumulator) are input to the four-bit adders 406a–406d and in combination with the information from the low frequency part 404 produce a modulated signal at the outputs 426, 428 respectively. Analog-to-digital (A/D) converters 422, 424 are shown in the interface between the low frequency part 404 and the high frequency part 402 for circuit operation simulation purposes although the A/D converters are not required in an actual circuit physical implementation.

Figure 29:
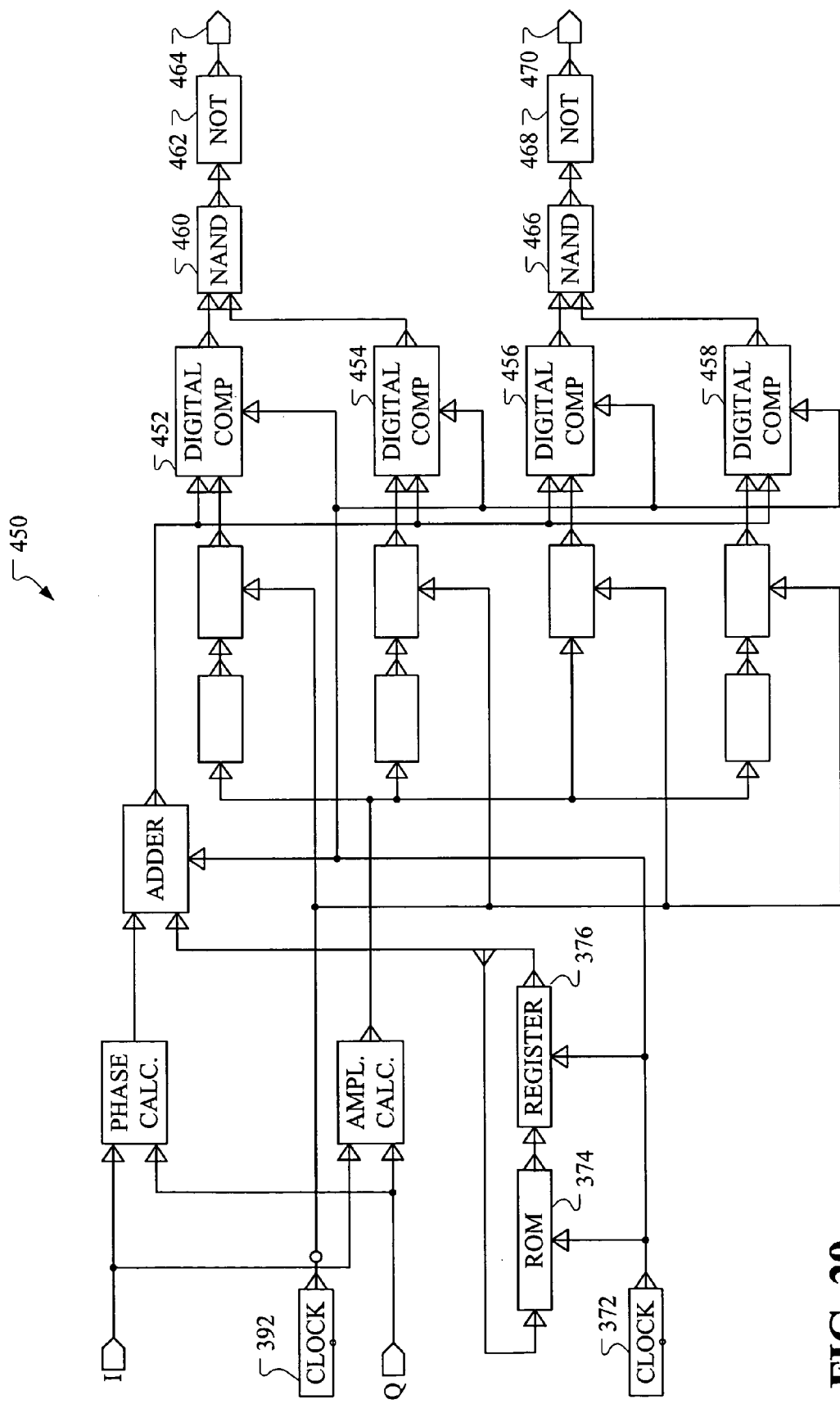
FIG. 29 is a schematic functional block diagram of the analog pulse width modulator of FIG. 10 implemented as a digital bandpass pulse width modulator.

The analog modulator 100 illustrated in FIG. 10 can be transformed to produce the BP-PWM digital circuit generally designated 450 as shown in the schematic functional block diagram in FIG. 29 by substituting a suitable digital counterpart for each of the analog RF-component parts. The pulse width control in the comparator of FIG. 10 is changed to suit the saw wave used. The output pulses are positive if the total angle, $\theta=2\pi ft+\phi(t)$, where $\phi(t)$ represents the modulation and is given by the relationship in either Equation 6 or Equation 7:

$$\begin{cases} \theta > \pi + V_C \\ \theta < 2\pi - V_C \end{cases} \text{ or by} \qquad \text{Equation 6}$$

$$\begin{cases} \theta < V_C \\ \theta < \pi - V_C \end{cases} \qquad \text{Equation 7}$$

Now, dividing equations 6 and 7 in the low frequency and high frequency portions by $2\pi$ provides the comparison voltage relationships shown in Equation 8 and Equation 9 as characterized by the representative BP-PWM digital circuit shown in FIG. 29.

$$\begin{cases} \theta > 0.5 + V_C \\ \theta < 1 - V_C \end{cases} \text{ and} \qquad \text{Equation 8}$$

$$\begin{cases} \theta > V_C \\ \theta < 0.5 - V_C \end{cases} \qquad \text{Equation 9}$$

The same symbol is used in Equation 8 and Equation 9 for the comparison voltage in each case although they also differ by $2\pi$. Four digital comparators 452, 454, 456, 458 are used to fulfill the Equation 8 and Equation 9 relationships. In each case for Equations 8 and 9, an AND-circuit function made up of a combination of a NAND-circuit 460 and a NOT-circuit 462 finalizes the comparison for the modulated signal at output 464, and a NAND-circuit 466 and a NOT-circuit 468 finalize the comparison for the modulated signal at output 470, respectively.

If the low and high frequency parts are directly connected, the output spectrum will have replicas of the desired spectrum at the distance of the lower frequency clock 392 from the carrier as shown in FIG. 18. If this is a problem, it is possible to control the lower frequency clock as shown by the spectrum in FIGS. 25 and 26, but another choice is to use an interpolator at the interface of the parts between the low frequency and high frequency sections. The interpolator does not have to increase the frequency up to the higher frequency clock 372; some intermediate value would suffice.

Although two outputs are used in the modulator for the PWM and PPM modulation systems discussed above, two outputs are necessary for the modulator in the PPM modulation system only. That is, any of the pulse width modulated output signals such as the ones described above contains the desired modulation. As a consequence, any possible imbalance in the output of the power amplifier and balun affects only the average power level and does not deteriorate the modulation. In the case of a PPM modulation system, any imbalance will affect the modulation and can be removed by either adaptive tuning or compensated for by using a suitable pre-distortion. One method for tuning to remove distortion from imbalance is to use separate controllable supply voltages for the two power amplifiers and to adjust the supply voltages until the desired amplitude balance has been achieved. It is also possible to use tunable attenuators between the power amplifier and the balun, but the attenuation should be made negligible in balanced conditions. Moreover, the magnitude of the attenuation would be equal to the output imbalance and would also attenuate half of the signal and decrease the efficiency of the modulator.

Adaptive tuning requires the current level of imbalance be known. The imbalance is related to the DC-level of the output signal prior to the bandpass filter, and the DC-level can be determined by using a suitable lowpass filter. Moreover, the polarity sign of the DC-level is indicative of the direction the control should be moved. Adaptive tuning requires the loop to operate over a wide dynamic range of the output power. At low power levels the indicated DC-level is low and the loop gain should be very high. On the other hand, high loop gain may cause stability problems at high power levels. One solution to overcome any stability problem is to use a tunable loop gain. Instead of using a closed loop at low power levels, it might be more feasible to rely on the correction determined at high levels and use the correction below a certain level; that is, the loop would be open below this level. This correction will also help with noise problems caused by a very high gain in the loop. An obvious drawback with this method is that the system becomes more complex.

Pre-distortion also requires feedback, but it would be necessary to use A/D-converters as well to utilize suitable digital signal processing DSP-algorithms. On the other hand, no algorithm can correct the original error in the balance since the pulse amplitudes cannot be controlled; that is, only a partial compensation is possible using DSP algorithms and the original dynamic range cannot be achieved. For instance, a maximum imbalance occurs when the signal in the other branch is totally vanished or cancelled. In this case it can readily be seen that no control of the placement of the pulses can produce the required amplitude variation. In a practical situation where the imbalance is only partial, it is possible to add an extra shift for the pulses in a way that produces the desired output level. However, this shift also affects the phase of the output signal. For example, let us assume in an ideal balun the input signal amplitudes are $A_1$ and $A_2$. By ignoring the pulse width variation (setting $\tau=T/2$), the output signal Fourier series will be given by Equation 10:

$$h(t) = \frac{A_1 - A_2}{2} + \frac{2(A_1 - A_2)\cos\left(\frac{\Delta T n \pi}{T}\right)}{n\pi}\cos\left(n\frac{2\pi}{T}t\right) + \frac{2(A_1 + A_2)\sin\left(\frac{\Delta T n \pi}{T}\right)}{n\pi}\sin\left(n\frac{2\pi}{T}t\right)$$

Equation 10 where Equation 10 represents the amplitude and Equation 11 represents the phase of each harmonic:

$$E_n = \frac{2\sqrt{A_1^2 + A_2^2 - 2A_1 A_2 \cos\left(\frac{2\Delta T n \pi}{T}\right)}}{n\pi}$$

Equation 11

$$\phi_n = \arctan\left[\frac{A_1 + A_2}{A_1 - A_2}\tan\left(\frac{\Delta T n \pi}{T}\right)\right]$$

Equation 12

The equations clearly show that the phase depends on $\Delta T$, although it should not. As $\Delta T$ varies from 0 to $T/2$, $$\cos\left(\frac{2\Delta T n \pi}{T}\right)$$

varies from 1 to −1. Hence, $E_1$ (first harmonic) varies between $2|A_1-A_2|/\pi$ and $2|A_1+A_2|/\pi$. Consequently, for $A_1 \neq A_2$, the minimum allowed amplitude is non-zero, which causes unavoidable distortion that depends on the specific modulation type used. The problem with imbalance together with the PPM can be partially avoided by combining the branches at the output of the modulator to create a BP-PWM signal, and by further dividing the resultant three-state signal into two two-state PWM signals.

The above discussion describes the case where the desired output is simultaneously the first harmonic of the modulator output signal. However, it is also possible to utilize the higher harmonics of the modulator output as well. As Equation 1 denotes, the amplitude of the $n^{th}$ harmonic is proportional to $\sin(n*\phi_1)$, where $\phi_1$ denotes a parameter related to the first harmonic. Hence, by dividing the amplitude signal in the pre-distortion part of the modulator by n, a distortionless amplitude can be arranged for the $n^{th}$ harmonic. Likewise, it is known that the angle of the $n^{th}$ harmonic of a sinusoidal signal passing a nonlinear device exhibits similar expansion; that is, it will be multiplied by n. By dividing the angle related to the I- and Q-signals by n, we can arrange the correct phase modulation for the $n^{th}$ harmonic. This method can be utilized by using the modulator at a lower frequency than would otherwise be possible. The benefit would be exceptionally high for a fully digital modulator by allowing a lower clock frequency. The switching mode power amplifier still preserves the good efficiency, provided that the harmonics are terminated with a high impedance. When using an $n^{th}$ harmonic, where $n \geq 3$, the strong first harmonic must be filtered to produce an acceptable modulated output signal.

FIG. 27 presents an example where the low frequency calculations have been replaced by two look-up tables in ROM 396, 398, respectively. This method can be extended by including the high frequency adders 360, 362 within the look-up tables in ROM as well. Obviously, the memory must then operate at the higher clock frequency. The memory size required can be approximated by assuming that an eight-bit quantization is used for the I- and Q-signals. The local oscillator signal also requires eight bits and the memory element size is one bit. In addition, two look-up tables in ROM are required. Hence, the estimated size of the memory is $2 \times 2^8 \times 2^8 \times 2^8 \approx 33.5$ Mbits.

Although the purpose of the modulator in traditional power amplifier bandpass signal generation is particularly to help improve the power amplifier efficiency by allowing the use of a switching mode power amplifier, the described modulator can also be used by generating the final modulation immediately following the modulator; that is, by having the summing point and bandpass filter immediately following the modulator. This makes it possible to utilize the existing variable gain amplifiers and linear power amplifiers. There are several methods that can be used to control the modulated output power, including: (1) tuning of the I- and Q-signals; (2) tuning pulse positions in connection with pulse width modulation or tuning pulse widths in connection with pulse position modulation; (3) tuning the supply voltage of the PA switches using a (slow) DC/DC-converter; and (4) using a tunable attenuator after the power amplifier.

Methods (1) and (2) are restricted by the out-of-band noise and spurious levels. Method (3) is restricted by the DC/DC-converter usable range and by the minimum supply voltage of the power amplifier. The advantage of methods 1, 2 and 3 is that the good efficiency of the switching mode power amplifier is preserved.

The tunable attenuation of method (4) has no inherent range limitations. However, the efficiency will be poor if it is the only method. Thus, a tunable attenuator should be used together with a more efficient power control method in such a way that a 20–30 dB range in the upper part of the total dynamic range uses the efficient method and the rest of the total range is addressed by the attenuator. This type of a power control method also simplifies the design of the feedback loop mentioned above as it decreases the dynamic range requirement at the output of the balun.

FIGS. 21 and 22 discussed above show how the number of bits in the local oscillator affects the signal quality. Since the requirement for spectral purity usually relaxes at low power levels compared to operation at maximum power, it might be possible to reduce current consumption at low power levels by utilizing this phenomenon.

The out-of-band noise level is affected by the number of bits in the calculations or tables, and can be decreased to some extent by increasing the number of bits. If the out-of-band noise and/or spurious signals are too strong in the case of pulse position modulation, it is possible to use a bandpass filter between the modulator and the power amplifier. The signal at the input of the power amplifier will then no longer be a square wave but a sinusoidal signal, and therefore more vulnerable to external disturbances. Moreover, the power amplifier itself may require better drivers. It is not possible to use a bandpass filter between the modulator and power amplifier in the case of pulse width modulation, since the information inserted in the widths of the pulses would disappear.

A transmitter structure having switching mode power amplifiers using pulse width modulation (PWM) and pulse position modulation (PPM) for producing bandpass carrier signals has been described above in several preferred embodiments. Various changes and modifications to the embodiments disclosed may be made, for example, using large scale integration circuits or application specific integrated circuits (ASIC) to combine function implementation such as, for example, phase modulation within the carrier generation function, without departing from the spirit and scope of the invention. Therefore, the invention is described by way of illustration rather than limitation.

What is claimed is:

1. A transmitter structure comprising:
a modulator comprising: a local oscillator configured to generate a carrier frequency; a low-frequency portion configured to determine the phase information content and the amplitude information content of an input signal, a high frequency RF portion configured to generate a modulated RE signal by modulating said carrier signal and a switching mode amplifier configured to amplify the modulated RF signal; and characterized by further comprising:
the high frequency RF portion configured to generate a first modulated RF signal by modulating said carrier signal according to the phase information content as a first two-state signal and a second modulated RF signal by modulating said carrier signal according to the amplitude information content as a second two-state signal;
the switching mode power amplifier further characterized by two parallel switching mode amplifiers connected to said modulator, each of said two parallel switching mode amplifiers amplifying a respective one of the first and second modulated RF signals;
coupling means having its input connected to a respective output of said two parallel switching mode amplifiers for receiving and combining the amplified first and second modulated RF signals as a three-state signal for delivery to a load.

2. The transmitter structure as defined in claim 1, wherein said amplitude and said phase information content signals are encoded as pulse width modulated (PWM) signals.

3. The transmitter structure as defined in claim 1, wherein said amplitude and said phase information content signals are encoded as pulse position modulated (PPM) signals.

4. The transmitter structure as defined in claim 1, wherein said switching mode power amplifier further comprises two Class-D amplifiers.

5. The transmitter structure as defined in claim 2, further including said local oscillator and said modulator high-frequency RF portion comprising a phase modulator to generate a substantially sinusoidal RF frequency signal having phase information corresponding to the phase input signal and comparator means for receiving said RF frequency signal and an amplitude-related signal having amplitude information corresponding to the amplitude input signal to generate a bandpass pulse width modulation (BP-PWM) signal.

6. The transmitter structure as defined in claim 5, further including a stabilization feedback loop comprising a rectifier and lowpass filter connected in series between the output of said phase modulator and said amplitude information determining means.

7. The transmitter structure as defined in claim 3, further comprising an analog modulator having a first phase modulator coupled to said phase information determining means and a second phase modulator coupled to said amplitude determining means wherein the total phase difference between the output of said first and second phase modulators is equal to $\pi$ corresponding to fully differential output signals.

8. The transmitter structure as defined in claim 3, wherein said modulator further comprises a digital modulator having a slow frequency part for determining the phase and amplitude information content encoded in said phase and amplitude input signals, respectively, and a high frequency part for generating a bandpass pulse position modulation (BP-PPM) signal, said digital modulator further including a digital local oscillator comprising an N-bit wide phase accumulator having a clock input and an increment equal to M wherein the clock frequency $f_c$ is related to the desired modulator output frequency by the relationship $$f_c = \frac{2^N}{M} f_o.$$

9. The transmitter structure as defined in claim 3, wherein said modulator comprises a digital modulator having a slow frequency part for determining the phase and amplitude information content encoded in said phase and amplitude input signals, respectively, and a high frequency part for generating a bandpass pulse position modulation (BP-PPM) signal, said digital modulator further including a digital local oscillator comprising a ROM-based state machine and digital adders coupled to the digital local oscillator and the phase and amplitude information content determining means for generating the BP-PPM modulation signal.

10. The transmitter structure as defined in claim 9, wherein the phase and amplitude information content determining means further comprise look-up tables in ROM to increase signal-processing speed.

11. The transmitter structure as defined in claim 2, wherein said modulator comprises a digital modulator having a slow frequency part for determining the phase and amplitude information encoded in phase and amplitude input signals, respectively, and a high frequency part for generating a bandpass pulse width modulation (BP-PWM) signal, said digital modulator further including a digital local oscillator comprising a ROM-based state machine and digital comparators coupled to the digital oscillator and the phase and amplitude information content determining means for generating the BP-PWM modulation signal.

12. A transmitter structure comprising:
a modulator having amplitude and phase input signals, said modulator further comprising a low-frequency portion, a high-frequency RF portion and a local oscillator for generating a bandpass carrier signal;
a switching mode power amplifier (SMPA) for amplifying the bandpass carrier signal;
signal combining means for delivering said bandpass earner signal to a load;
said modulator low-frequency portion further including means for determining the amplitude and phase information content of a modulation signal encoded in said amplitude and phase input signals;
said amplitude and said phase information content signals are encoded as pulse position modulated (PPM) signals;
wherein said modulator further comprises a digital modulator having a slow frequency part for determining the phase and amplitude information content encoded in said amplitude and phase input signals, respectively, and a high frequency part for generating a bandpass pulse position modulation (BP-PPM) signal, said digital modulator further including a digital local oscillator comprising a ROM-based state machine and digital adders coupled to the digital local oscillator and the phase and amplitude information content determining means for generating the BP-PPM modulation signal.

13. The transmitter structure as defined in claim 12, wherein said SMPA is a balanced SMPA coupled intermediate said signal combining means and said load.

14. The transmitter structure as defined in claim 12, wherein said SMPA is a balanced SMPA coupled intermediate said modulator and said signal combining means.

15. A transmitter structure comprising:
a modulator having amplitude and phase input signals, said modulator further comprising a low-frequency portion, a high-frequency RF portion and a local oscillator for generating a bandpass carrier signal;
a switching mode power amplifier (SMPA) for amplifying the bandpass carrier signal;
signal combining means for delivering said bandpass carrier signal to a load;
said modulator low-frequency portion further including means for determining the amplitude and phase information content of a modulation signal encoded in said amplitude and phase input signals;
said amplitude and said phase information content signals as pulse width modulated (PWM) signals;
said local oscillator and said modulator high-frequency RF portion comprising a phase modulator to generate a substantially sinusoidal RF frequency signal having phase information corresponding to the amplitude and phase input signal and comparator means for receiving said RF frequency signal and an amplitude-related signal having amplitude information corresponding to the amplitude and phase input signal to generate a bandpass pulse width modulation (BP-PWM) signal.

16. A transmitter structure comprising;
a modulator having amplitude and phase input signals, said modulator further comprising a low-frequency portion, a high-frequency RF portion and a local oscillator for generating a bandpass carrier signal;
a switching mode power amplifier (SMPA) for amplifying the bandpass carrier signal;
signal combining means for delivering said bandpass carrier signal to a load;
said modulator low-frequency portion further including means for determining the amplitude and phase information content of a modulation signal encoded in said amplitude and phase input signals;
said amplitude and said phase information content signals as pulse width modulated (PWM) signals;
wherein said modulator comprises a digital modulator having a slow frequency part for determining the phase and amplitude information encoded in said amplitude and phase input signals, respectively, and a high frequency part for generating a bandpass pulse width modulation (BP-PWM) signal, said digital modulator further including a digital local oscillator comprising a ROM-based state machine and digital comparators coupled to the digital oscillator and the phase and amplitude information content determining means for generating the BP-PWM modulation signal. and a switching mode amplifier configured to amplify the modulated RF signal; and characterized by further comprising:
the high frequency RF portion configured to generate a first modulated RF signal by modulating said carrier signal according to the phase information content as a first two-state signal and a second modulated RF signal by modulating said carrier signal according to the amplitude information content as a second two-state signal;

the switching mode power amplifier further characterized by two parallel switching mode amplifiers connected to said modulator, each of said two parallel switching mode amplifiers amplifying a respective one of the first and second modulated RF signals;

coupling means having its input connected to a respective output of said two parallel switching mode amplifiers for receiving and combining the amplified first and second modulated RF signals as a three-state signal for delivery to a load.

* * * * *

UNITED STATES PATENT AND TRADEMARK OFFICE
CERTIFICATE OF CORRECTION

PATENT NO. : 6,993,087 B2
DATED : January 31, 2006
INVENTOR(S) : Rosnell et al.

It is certified that error appears in the above-identified patent and that said Letters Patent is hereby corrected as shown below:

Column 16,
Line 14, "RE" should be -- RF --.

Column 18,
Lines 60-80, should be deleted.

Signed and Sealed this

Eleventh Day of April, 2006

JON W. DUDAS
*Director of the United States Patent and Trademark Office*